United States Patent
Campbell

(10) Patent No.: US 7,613,265 B2
(45) Date of Patent: Nov. 3, 2009

(54) SYSTEMS, METHODS AND COMPUTER PROGRAM PRODUCTS FOR HIGH SPEED DATA TRANSFER USING AN EXTERNAL CLOCK SIGNAL

(75) Inventor: John E. Campbell, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 11/470,067

(22) Filed: Sep. 5, 2006

(65) Prior Publication Data

US 2008/0059831 A1 Mar. 6, 2008

(51) Int. Cl.
*H04L 7/02* (2006.01)
*H03D 3/24* (2006.01)

(52) U.S. Cl. ..................... 375/360; 375/376
(58) Field of Classification Search ......... 375/371–373, 375/376, 359–361; 365/233
See application file for complete search history.

(56) References Cited

U.S. PATENT DOCUMENTS

| | | | |
|---|---|---|---|
| 3,980,993 A | 9/1976 | Bredart et al. | |
| 4,953,077 A | 8/1990 | Alvarez, II et al. | |
| 5,237,676 A | 8/1993 | Arimilli et al. | |
| 5,440,751 A | 8/1995 | Santeler et al. | |
| 5,513,135 A | 4/1996 | Dell et al. | |
| 5,596,731 A | 1/1997 | Martinez, Jr. et al. | |
| 5,790,811 A | 8/1998 | Hewitt | |
| 5,809,258 A | 9/1998 | Bemanian et al. | |
| 5,896,347 A * | 4/1999 | Tomita et al. | 365/233.11 |
| 5,923,613 A | 7/1999 | Tien et al. | |
| 6,052,004 A | 4/2000 | Saeki | |
| 6,115,439 A | 9/2000 | Andresen et al. | |
| 6,134,670 A | 10/2000 | Mahalingaiah | |
| 6,173,382 B1 | 1/2001 | Dell et al. | |
| 6,282,592 B1 * | 8/2001 | Aston et al. | 710/100 |
| 6,378,020 B2 | 4/2002 | Farmwald et al. | |
| 6,498,766 B2 * | 12/2002 | Lee et al. | 365/189.15 |
| 6,510,100 B2 | 1/2003 | Grundon et al. | |
| 6,587,912 B2 | 7/2003 | Leddige et al. | |
| 6,611,537 B1 * | 8/2003 | Edens et al. | 370/503 |
| 6,611,893 B1 | 8/2003 | Lee et al. | |
| 6,633,994 B1 | 10/2003 | Hofmann et al. | |
| 6,748,507 B2 * | 6/2004 | Kawasaki et al. | 711/167 |
| 7,038,971 B2 * | 5/2006 | Chung | 365/189.16 |
| 2003/0046598 A1 * | 3/2003 | Crafts et al. | 713/503 |
| 2007/0074084 A1 * | 3/2007 | Mobin et al. | 714/700 |

FOREIGN PATENT DOCUMENTS

JP 01212911 A 8/1989

\* cited by examiner

*Primary Examiner*—Tesfaldet Bocure
(74) *Attorney, Agent, or Firm*—Cantor Colburn LLP

(57) ABSTRACT

Systems, methods and computer program products for capturing data. The methods include receiving an external clock signal having a first frequency, a first edge and a second edge. A clock period of the external clock period is the amount of time between any two successive first edges. The external clock signal is transformed into an internal clock signal based on the first edge and not the second edge of the external clock signal. Parallel data is received on a first plurality of signal links. The parallel data is received at a second frequency that is faster than the first frequency. The parallel data is captured using the internal clock signal.

29 Claims, 18 Drawing Sheets

SYSTEMS, METHODS AND COMPUTER PROGRAM PRODUCTS FOR HIGH SPEED DATA TRANSFER USING AN EXTERNAL CLOCK SIGNAL

BACKGROUND OF THE INVENTION

This invention relates generally to high speed data transfer, and more particularly to computer systems and methods for high speed data transfer.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

FIG. 1 relates to U.S. Pat. No. 5,513,135 to Dell et al., of common assignment herewith, which is hereby incorporated by reference in its entirety, and depicts an early synchronous memory module. The memory module depicted in FIG. 1 is a dual in-line memory module (DIMM). This module is composed of synchronous DRAMs 8, buffer devices 12, an optimized pinout, and an interconnect and capacitive decoupling method to facilitate high performance operation. The patent also describes the use of clock re-drive on the module, using such devices as phase-locked loops (PLLs).

Digital PLLs (DPLLs) are described, for example, in U.S. Pat. No. 6,115,439 to Andresen, et al (hereinafter "Andresen"), which is hereby incorporated by reference in its entirety. Andresen teaches a DPLL for receiving a reference clock signal and for generating a clock signal having a predetermined number of clock cycles during each cycle of the reference clock. The DPLL in Andresen includes a variable delay circuit for varying the length of each of the generated clock cycles so that they are in lock with the reference clock cycle. Compare circuitry in the clock multiplier determines whether the end of the generated clock cycles are within one of several thresholds relative to the end of the reference clock cycle. The length of the generated clock cycles is varied by an incremental delay based on the output of compare circuitry. Andresen further teaches that the clock multiplier is free running once lock is obtained between the reference clock and the generated clock.

FIG. 2 illustrates a simplified block diagram of a clock multiplier (DPLL) 240 taught by Andresen. Control block 242 receives an input clock CKref. Responsive to CKref, control block 242 outputs a clock signal CKa to variable delay circuit 244, along with delay control signals. Variable delay circuit 244 outputs clock signal CKar to control block 242. Control block 242 outputs a clock, CKout and a lock signal indicating whether the CKout is locked on the input signal CKref. As shown in FIG. 2, the clock multiplier 240 uses a single variable delay stage 244, which reduces the power consumed by the clock multiplier 240.

FIG. 3 illustrates a block diagram of the variable delay circuit 244 taught by Andresen. Clock CKa is received into a delay string 346 comprising fifteen delay elements 348 connected in series, where individual delay elements are referenced as delay elements 348a-348o. As would be clear to one skilled in the art, more or less delay elements could be used in the delay string 346. Switch 350 couples leads A and B across one of the delay elements 348. Switch 350 is controlled by the delay string controller (DSR) section of control block 242. Lead A couples the input side of the selected delay element 348 to a variable delay path 352 and lead B couples the output side of the selected delay element 348 to path 354. Variable delay path 352 comprises a buffer 356 and a plurality of capacitors 358 (fifteen capacitors 358 are shown in used in the embodiment of FIG. 3), individually referenced as capacitors 358a-358o. Capacitors 358 are selectively coupled in parallel between the output of buffer 356 and ground under control of the DSR section of control block 242. Path 354 comprises a buffer 360 and a plurality of capacitors 361 (individually referenced as capacitors 361a-361o) matching buffer 356 and capacitors 358. In this path the DSR section of the control block 242 uncouples all capacitive loads. An additional capacitor 362 is selectively coupled between the output of buffer 356 and ground and between the output of buffer 360 and ground under control of the epsilon controller (EC) section of control block 242. Paths 352 and 354 are coupled at commutator 364. The output of commutator 364 is clock CKar. Commutator 354 passes the edge of clock CKa which arrives first (either the edge which arrives via through path 352 or the edge that arrives through path 354). In operation, delay elements 348 provide coarse adjustment of the delay through variable delay circuit 344. When switch 350 couples leads A and B across delay element 348a, the smallest delay through the delay chain 346 is achieved, as CKa propagates through a single delay element 348. On the other hand, when switch 350 couples leads A and B across delay element 348o, the largest delay is achieved, since CKa must propagate through all the delay elements 348 in the delay string 346. The capacitors 358 (and capacitors 361) provide a finer resolution of delay through delay element 244. After propagating through the delay element(s) 348, the CKa signal propagates through the delay path 352. The capacitors may be individually coupled to ground under control of control block 242. Each capacitor 358 enabled by control block 242 slightly increases the delay of the propagation through the delay path 352. Each enabled capacitor 358 (or capacitor 361) approximately accounts for an additional 50 psec maximum delay through the path. The commutator 364 passes the first CKa clock edge, either from path 352 or path 354, in order to prevent discontinuities in the incremental delay provided by the variable delay circuit 244.

FIG. 4 illustrates a block diagram of the control block 242 as taught by Andresen. CKref is input to SRPD 470, which is a phase detector and multivibrator control circuit. The SRPD 470 outputs the CKa signal to the variable delay circuit 244 and to prescaler 472. SRPD 470 further outputs control signals to the DSR 474, a commutator controller (IC) 476 and the EC 478. The DSR (IC) 476 and EC 478 output delay control signals to the variable delay controller 244. In operation, the SRPD 470 receives the reference clock, CKref, and generates signals indicative of whether CKout is locked with CKref and whether it leads or lags CKref. The lock and up/down signals are passed to the DSR 474, IC 476 and EC 478 which adjust the delay through the delay string 346 and delay path 352 accordingly.

FIG. 5 relates to U.S. Pat. No. 6,173,382 to Dell et al., of common assignment herewith, which is hereby incorporated by reference in its entirety, and depicts a computer system 510 which includes a synchronous memory module 520 that is directly (i.e. point-to-point) connected to a memory controller 514 via a bus 540, and which further includes logic circuitry 524 (such as an application specific integrated circuit, or "ASIC") that buffers, registers or otherwise acts on the address, data and control information that is received from the memory controller 514. The memory module 520 can be programmed to operate in a plurality of selectable or programmable modes by way of an independent bus, such as an inter-integrated circuit (I2C) control bus 534, either as part of the memory initialization process or during normal operation. When utilized in applications requiring more than a single memory module connected directly to a memory controller, the patent notes that the resulting stubs can be minimized through the use of field-effect transistor (FET) switches to electrically disconnect modules from the bus.

Relative to U.S. Pat. No. 5,513,135, U.S. Pat. No. 6,173,382 further demonstrates the capability of integrating all of the defined functions (address, command, data, presence detect, etc) into a single device. The integration of functions is a common industry practice that is enabled by technology improvements and, in this case, enables additional module density and/or functionality.

FIG. 6, from U.S. Pat. No. 6,510,100 to Grundon et al., of common assignment herewith, which is hereby incorporated by reference in its entirety, depicts a simplified diagram and description of a memory system 610 that includes up to four registered DIMMs 640 on a traditional multi-drop stub bus. The subsystem includes a memory controller 620, an external clock buffer 630, registered DIMMs 640, an address bus 650, a control bus 660 and a data bus 670 with terminators 695 on the address bus 650 and the data bus 670. Although only a single memory channel is shown in FIG. 6, systems produced with these modules often included more than one discrete memory channel from the memory controller, with each of the memory channels operated singly (when a single channel was populated with modules) or in parallel (when two or more channels where populated with modules) to achieve the desired system functionality and/or performance.

FIG. 7, from U.S. Pat. No. 6,587,912 to Bonella et al., which is hereby incorporated by reference in its entirety, depicts a synchronous memory module 710 and system structure in which repeater hubs 720 include local re-drive of the address, command and data to local memory devices 701 and 702 via buses 721 and 722; generation of a local clock (as described in other figures and the patent text); and the re-driving of the appropriate memory interface signals to the next module or component in the system via bus 700.

FIG. 8 depicts a contemporary system composed of an integrated processor chip 800, which contains one or more processor elements and an integrated memory controller 810. In the configuration depicted in FIG. 8, multiple independent cascade interconnected memory interface busses 806 are logically aggregated together to operate in unison to support a single independent access request at a higher bandwidth with data and error detection/correction information distributed or "striped" across the parallel busses and associated devices. The memory controller 810 attaches to four narrow/high speed point-to-point memory busses 806, with each bus 806 connecting one of the several unique memory controller interface channels to a cascade interconnect memory subsystem 803 (or memory module) which includes at least a hub device 804 and one or more memory devices 809. Some systems further enable operations when a subset of the memory busses 806 are populated with memory subsystems 803. In this case, the one or more populated memory busses 808 may operate in unison to support a single access request.

It is desirable to be able to increase the bandwidth of DRAM device access in order to increase the speed with which data can be read and written to DRAM devices. One approach to increasing the bandwidth is taught by U.S. Pat. No. 6,378,020 to Farmwald et al. (hereinafter "Farmwald"), which is hereby incorporated by reference in its entirety. Farmwald teaches a memory subsystem that includes at least two semiconductor devices (including at least one memory device), connected in parallel to a bus, where the bus includes a plurality of bus lines for carrying substantially all address, data and control information needed by the memory devices. The control information includes device-select information and the bus has substantially fewer bus lines than the number of bits in a single address, and the bus carries device-select information without the need for separate device-select lines connected directly to individual devices. Farmwald teaches that the DRAMs and other devices receive address and control information over the bus and transmit or receive requested data over the same bus. Each memory device contains only a single bus interface with no other signal pins. Other devices that may be included in the system can connect to the bus and other non-bus lines, such as input/output lines. The bus supports large data block transfers and split transactions to allow a user to achieve high bus utilization. Farmwald teaches that high bus bandwidth is achieved by running the bus at a very high clock rate (hundreds of MHz).

Farmwald further teaches that an important part of its input/output circuitry is that it generates an internal device clock based on early and late external bus clocks. Farmwald teaches that controlling clock skew (the difference in clock timing between devices) is important in a system running with 2 nanosecond cycles, thus the internal device clock is generated so that the input sampler (for capturing data) and the output driver operate as close in time as possible to midway between bus clocks. Thus, the data is sampled based on both the rising edge and the falling edge of a single clock period of one or more of the external bus clocks.

A drawback of the approach taught by Farmwald, where data is sampled based on both edges of a single clock period is that the symmetry of the clock period has to be taken into account. Typically such clocking is avoided for high-speed applications because electrical characterstics (capacitance, inductance etc) of the environment have a different effect on the rising edge of a clock signal than on the falling edge. Furthermore, the switching level of a receiver receiving a rising clock edge may be very different than that of the receiver receiving the falling clock edge. In addition, such a clock mechanism requires the positive phase and negative phase of the clock period be identical. Additionally, other anomalies such as jitter and drift may adversely affect such a clocking scheme.

It would be desirable to have a memory subsystem that avoids the above drawbacks while providing a high speed bus for transferring multiple data phases in a single clock period.

BRIEF SUMMARY OF THE INVENTION

Embodiments include a method for capturing data including receiving an external clock signal having a first frequency, a first edge and a second edge. A clock period of the external clock period is the amount of time between any two successive first edges. The external clock signal is transformed into an internal clock signal based on the first edge and not the second edge of the external clock signal. Parallel data is received on a first plurality of signal links. The parallel data is received at a second frequency that is faster than the first frequency. The parallel data is captured using the internal clock signal.

Embodiments also include a system for capturing data. The system includes an external clock port, a first plurality of signal link ports and logic in communication with the external clock port and the signal link ports. The external clock has a first frequency, a first edge, and a second edge. A clock period of the external clock signal is the amount of time between any two successive first edges. The signal link ports receive parallel data at a second frequency that is faster than the first frequency. The logic facilitates transforming the external clock signal into an internal clock signal based on the first edge and not the second edge of the external clock signal. The logic also facilitates capturing the parallel data using the internal clock signal.

Further embodiments include a service for deploying technology for high speed data transfer. The service includes creating information for any one of making, using or selling technology for high speed data transfer. The technology includes an external clock port, a first plurality of signal link ports and logic in communication with the external clock port and the signal link ports. The external clock has a first frequency, a first edge, and a second edge. A clock period of the external clock signal is the amount of time between any two successive first edges. The signal link ports receive parallel data at a second frequency that is faster than the first frequency. The logic facilitates transforming the external clock signal into an internal clock signal based on the first edge and not the second edge of the external clock signal. The logic also facilitates capturing the parallel data using the internal clock signal. The service further includes deploying the created information to one or more customers via a distribution process.

Further embodiments include a buffer device in a memory system including an external clock port, a first plurality of signal link ports and logic in communication with the external clock port and the signal link ports. The external clock has a first frequency, a first edge, and a second edge. A clock period of the external clock signal is the amount of time between any two successive first edges. The signal link ports receive parallel data at a second frequency that is faster than the first frequency. The logic facilitates transforming the external clock signal into an internal clock signal based on the first edge and not the second edge of the external clock signal. The logic also facilitates capturing the parallel data using the internal clock signal.

Still further embodiments include a computer program product for capturing data including a storage medium readable by a processing circuit and storing instructions for execution by the processing circuit for performing a method. The method includes receiving an external clock signal having a first frequency, a first edge and a second edge. A clock period of the external clock period is the amount of time between any two successive first edges. The external clock signal is transformed into an internal clock signal based on the first edge and not the second edge of the external clock signal. Parallel data is received on a first plurality of signal links. The parallel data is received at a second frequency that is faster than the first frequency. The parallel data is captured using the internal clock signal.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Exemplary embodiments include circuitry to clock a plurality of successive data packets on a single bus based on a single edge of a single clock period. The single external clock is received by the receiving element and is used to form an internal clock(s) via a phase locked loop (PLL) circuit. The internal clock(s) is used to sample the incoming data. In exemplary embodiments, the internal clock(s) runs at a higher frequency than the external clock, commensurate with the frequency of the data packets. In further exemplary embodiments, the circuitry includes a plurality of external clocks provided for data on a single data bus. Each of the external clocks is used for a corresponding data packet on the data bus.

Figure 9:
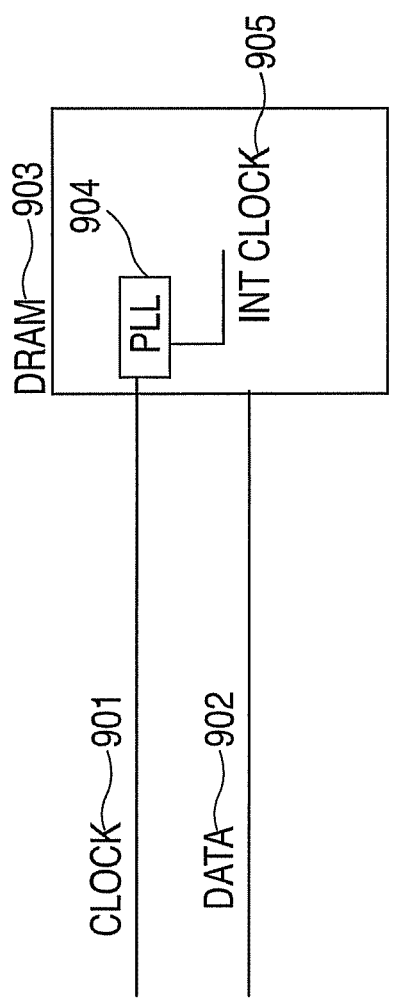
FIG. 9 depicts an exemplary embodiment of the present invention including a parallel data bus comprising two or more signal links and an external clock.

FIG. 9 depicts an exemplary embodiment of the present invention including a parallel data bus 902 preferably comprising two or more signal "links", or "wires", and an external clock 901. The data bus 902 may be a unidirectional bus or a bidirectional bus, and the data bus may be implemented using convention signals, multi-level signals, differential signals or other signals well known in the art. In exemplary embodiments, the sampling of data packets on the parallel data bus 902 is synchronized with the leading edge of the external clock 901. The circuit 903 receiving the data includes a phase locked loop (PLL) circuit 904 which generates one or more internal clocks 905 for use on the circuit 903.

The example circuit 903 in FIG. 9 in the present embodiment is located on (or is integrated into) a DRAM, but the circuit 903 could by any circuit requiring high-speed transmission. In exemplary embodiments, the circuit 903 includes an external clock port for receiving the external clock 901, signal link ports for communicating with wires on the parallel data bus 902 for receiving parallel data 1002, and logic for facilitating the creation of the internal clock 905. The logic may be implemented by any combination of hardware and/or software.

When the circuit 903 is a DRAM, or other memory device, the internal clock 905 may be utilized to read data from the memory device and/or to write data to the memory device. When the circuit 903 is located on (or is integrated into) a buffer device in a memory subsystem, the internal clock 905 may be utilized to transfer data to and receive data from memory devices that are in communication with the buffer device, and/or to communicate to another buffer device or to a memory controller in the memory system. When the circuit 903 is located on (or is integrated into) a memory controller, the internal clock may be utilized to transmit and/or to receive data from buffer devices and/or memory devices in the memory system. These examples are not exhaustive, as exemplary embodiments may be utilized in any application where high speed data transmission is required.

Figure 10:
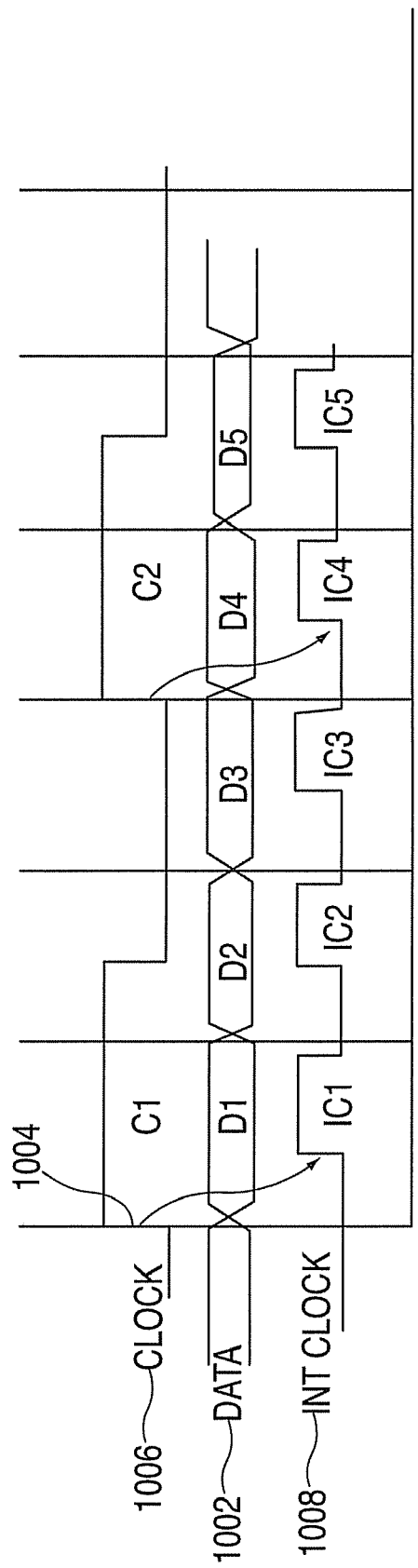
FIG. 10 depicts a timing diagram for the configuration depicted in FIG. 9.

FIG. 10 depicts an exemplary clock structure implemented by exemplary embodiments depicted in FIG. 9. The external clock signal 1006 associated with the external clock 901 has a positive transition initiating the positive pulse "C1" of the clock period. Three pulses (IC1, IC2, IC3) of the internal clock signal 1008 associated with the internal clock 905 are generated based on the leading edge 1004 of the external clock signal 1006. The number of pulses and the relationship of the pulses of the internal clock signal 1008 (IC1, IC2, IC3) to each other and to the external clock signal 1006 are design specific, as are the shapes of the internal clock signals 1008. Pulses of the internal clock signal 1008 are used to capture corresponding parallel data 1002 on the parallel data bus 902. As depicted in FIG. 10, three data phases (e.g., packets) of parallel data 1002 are received in the first period of the external clock signal 1006. Thus, the parallel data is received at a faster frequency than the frequency of the external clock signal 1006. As shown in FIG. 10, the next period of the external clock signal 1006, labeled "C2" initiates more pulses (IC4, IC5, etc.) of the internal clock signal 1008.

Data is captured at a circuit 903 (e.g., a memory device) at a higher frequency than the frequency of the external clock signal 1006. The external clock signal 1006 has a first frequency, a first edge and a second edge. The term "clock period" as used herein refers to the amount of time between any two successive first edges. In exemplary embodiments, the first edge is the rising edge and the second edge is the falling edge. In other exemplary embodiments, the first edge is the falling edge and the second edge is the rising edge.

Once the external clock 901 is received at the circuit 903, it is transformed into an internal clock 905 based on the first edge, and not the second edge of the external clock signal 1006. Thus, the internal clock signal 1008 is generated in response to either the rising edge or the falling edge of the external clock signal 1006. In exemplary embodiments, a PLL 904 is used to transform the external clock 901 into the internal clock 905. Parallel data 1002 is received on the parallel data bus 902 (also referred to herein as a "plurality of signal links") at a second frequency that is faster than the frequency of the external clock 901 (i.e., the first frequency). The parallel data 1002 is captured using the internal clock 905 that has a frequency that corresponds to the frequency of the parallel data 1002 on the parallel data bus 902 (i.e., it corresponds to the second frequency).

In exemplary embodiments, the parallel data 1002 is formatted as a parallel word, where a word of data spans two or more signal links in the parallel data bus 902. In alternate exemplary embodiments, the parallel data 1002 is formatted as a serial word, where a word of data spans a single signal link in the parallel data bus.

Figure 11:
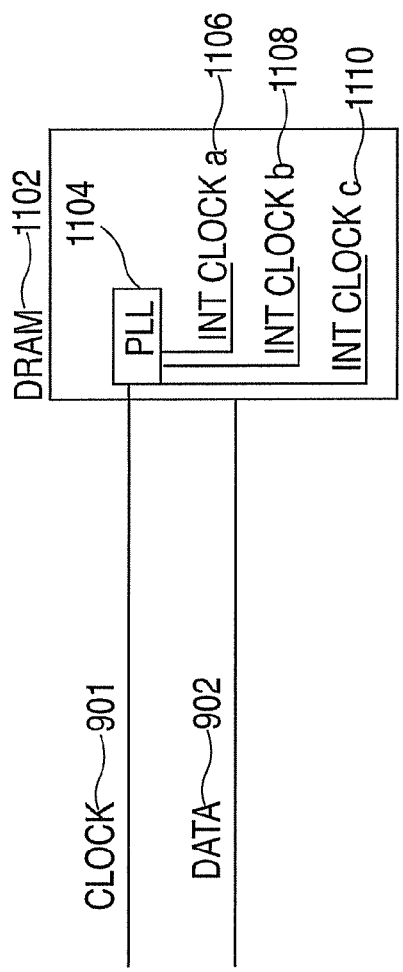
FIG. 11 depicts an exemplary embodiment where a PLL generates three separate internal clocks from the leading edge of the external clock.
Figure 12:
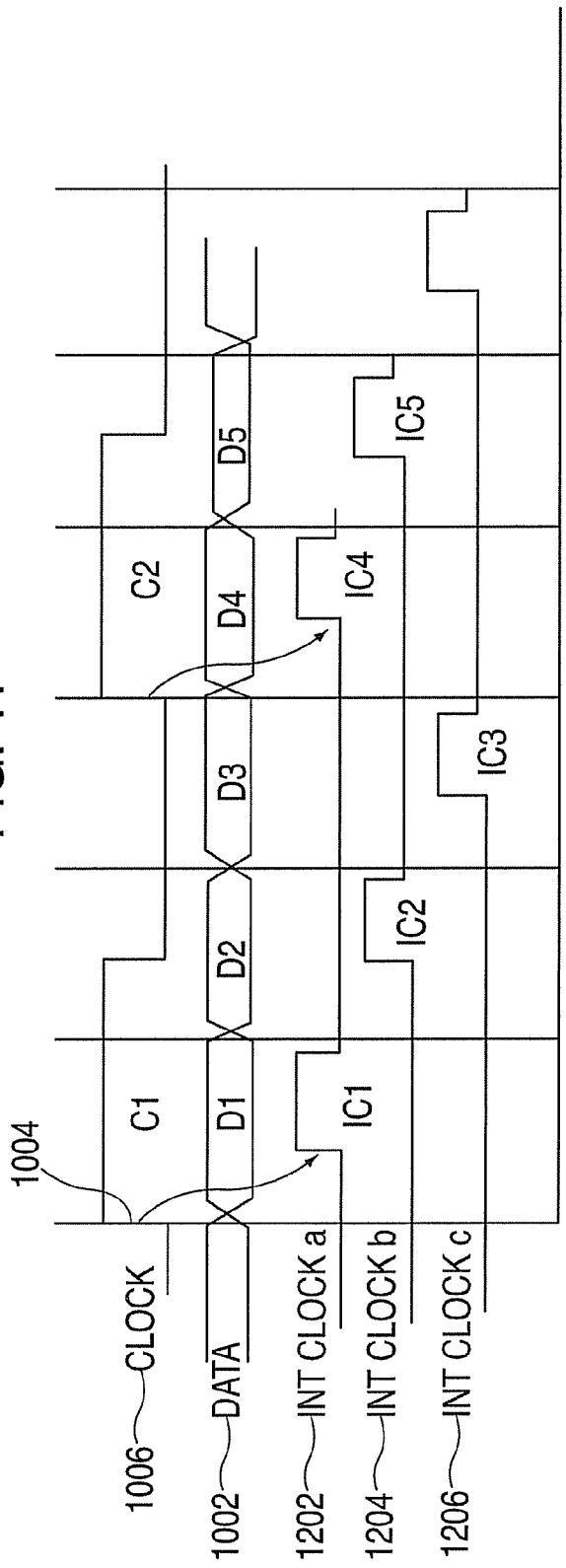
FIG. 12 depicts a timing diagram for the configuration depicted in FIG. 11.

FIG. 11 depicts an exemplary embodiment where a PLL 1104 generates a plurality of separate internal clocks 1106, 1108 and 1110 from the leading edge 1004 of the external clock signal 1006. The timing for this example depicted in FIG. 11 is shown in FIG. 12 where the internal clocks 1202, 1204 and 1206 are at the same frequency as the external clock signal 1006, but are each delayed by a different amount of time. Internal clock 1202 is utilized to capture data phase "D1", internal clock 1204 to capture data phase "D2" and internal clock 1206 to capture data phase "D3". The resulting data capture rate of the parallel data 1002 using three internal clocks 1202, 1204 and 1206 is similar to the data capture rate depicted in FIG. 10, in that one external clock period is equal to three data periods. Technology specific considerations, such as available ports for the internal clock, clock period symmetry requirements, clock distribution and clocking controls (clock single stepping, stopping and the like) may be considered to determine which of the implementations best suits a given installation. Multiple clock signal lines provide flexibility of phase length and even overlapping signals whereas a single highspeed clock requires fewer wires and/or fewer module inputs/outputs.

Figure 13:
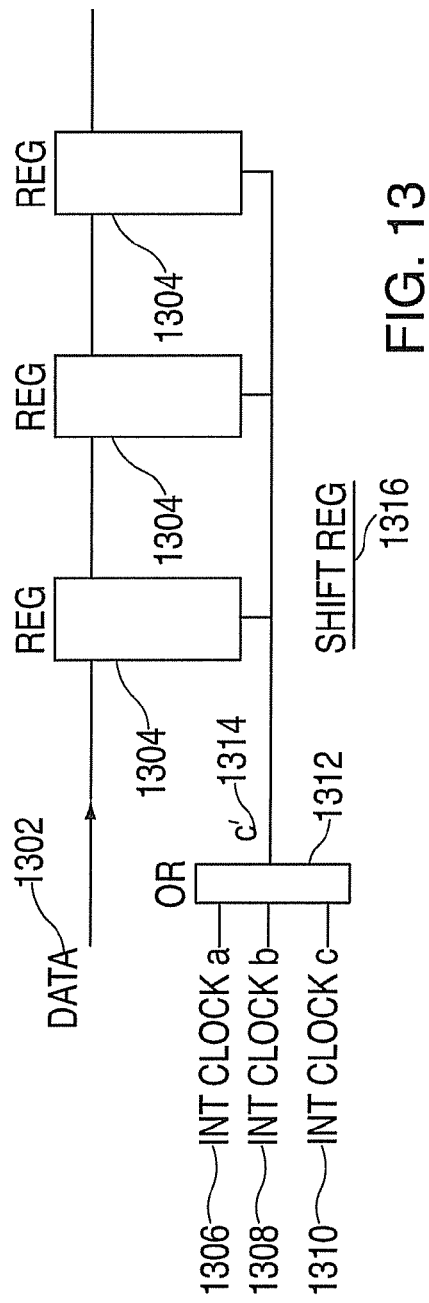
FIG. 13 depicts a configuration including a shift register that may be implemented by exemplary embodiments.
Figure 14:
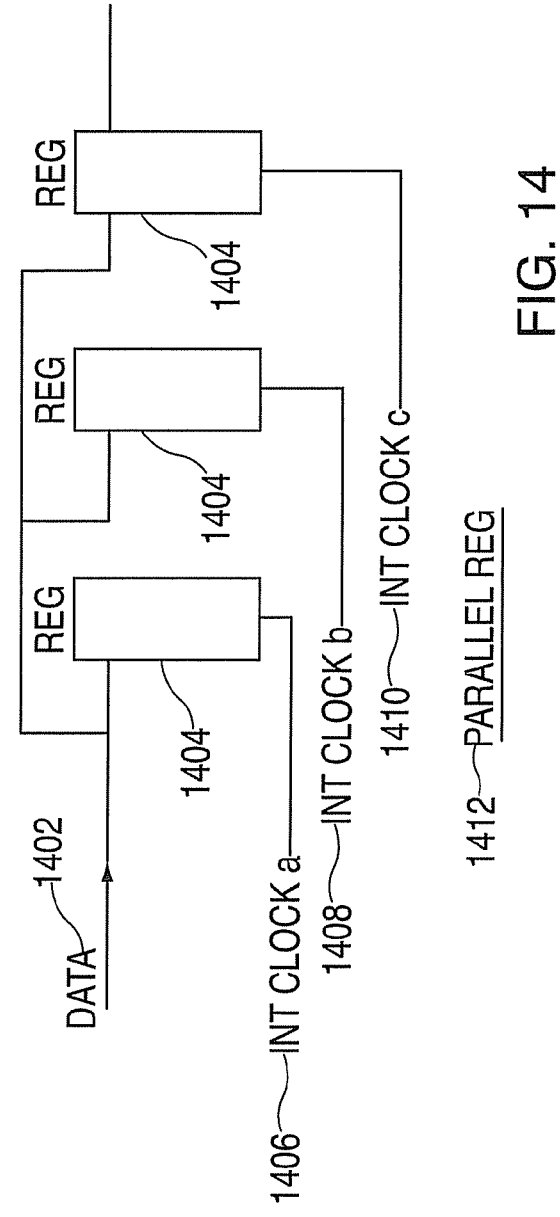
FIG. 14 depicts a configuration including a parallel register that may be implemented by exemplary embodiments.

The internal clocks (e.g., 1106, 1108, 1110) that are generated may be used in any manner known in the art. In the example depicted in FIG. 13, the three internal clocks 1306,

1308 and 1310 are input to an OR gate 1312 together to form a single internal clock 1314. The single internal clock 1314 is utilized to operate a shift register 1316 for receiving data 1302 into three registers 1304. FIG. 14 depicts another example comprising a parallel register 1412 where each register 1404 separately receives data 1402 at respective internal clocks 1406, 1408 and 1410. It should be noted that the embodiment depicted in FIG. 14 does not require that the internal clocks 1406, 1408 and 1410 be non-overlapping clocks. This would also be true if the registers 1404 were edge trigger latches, for example. A variety of clock pulse generators and pulse shapers (e.g., implemented by a PLL) may be employed as is well known in the art.

In exemplary embodiments, a plurality of external clocks are received at a circuit and utilized to create one or more internal clocks for capturing data at a higher frequency than the frequency of each of the external clocks. The external clocks include at least a first external clock and a second external clock. Each of the external clock signals have a first frequency, a first edge and second edge, where the clock period of each of the external clocks is the amount of time between any two successive edges. In exemplary embodiments the external clocks have the same frequencies and clock periods and in other exemplary embodiments, at least one of the external clocks has a frequency and clock period that is different than the other external clocks. Data is received on one or more signal links at a second frequency that the first frequency. The data includes at least a first data pulse and a second data pulse. The data is captured at the second frequency.

In exemplary embodiments, the first data pulse is captured based on the first edge of the first external clock signal and the second data pulse is captured based on the first edge of the second external clock signal. In this manner, if the external clocks have the same first frequency, the data is captured at the second frequency. The second frequency is twice (because two external clocks are being used) the first frequency. Exemplary embodiments can further transmit data on signal links (either the same ones used to receive data or different ones) at the second frequency.

Figure 15:
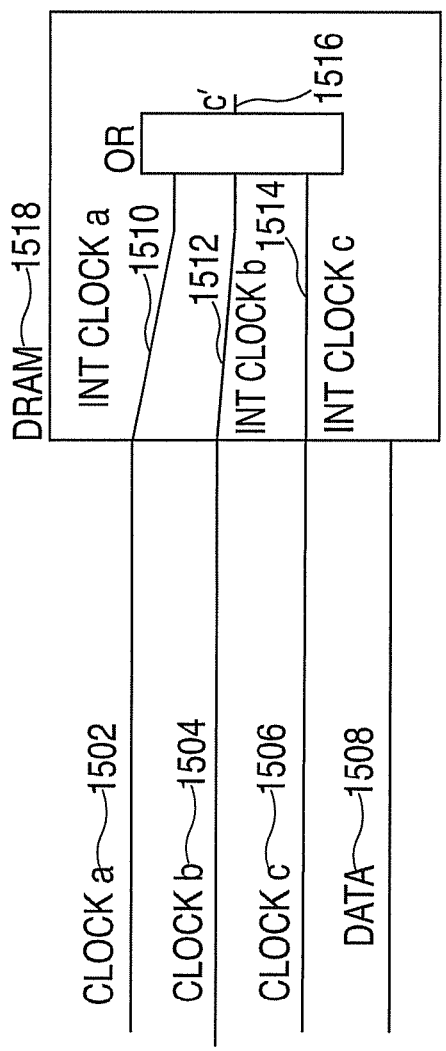
FIG. 15 depicts a data bus and a plurality of external clocks that may be implemented by exemplary embodiments.
Figure 16:
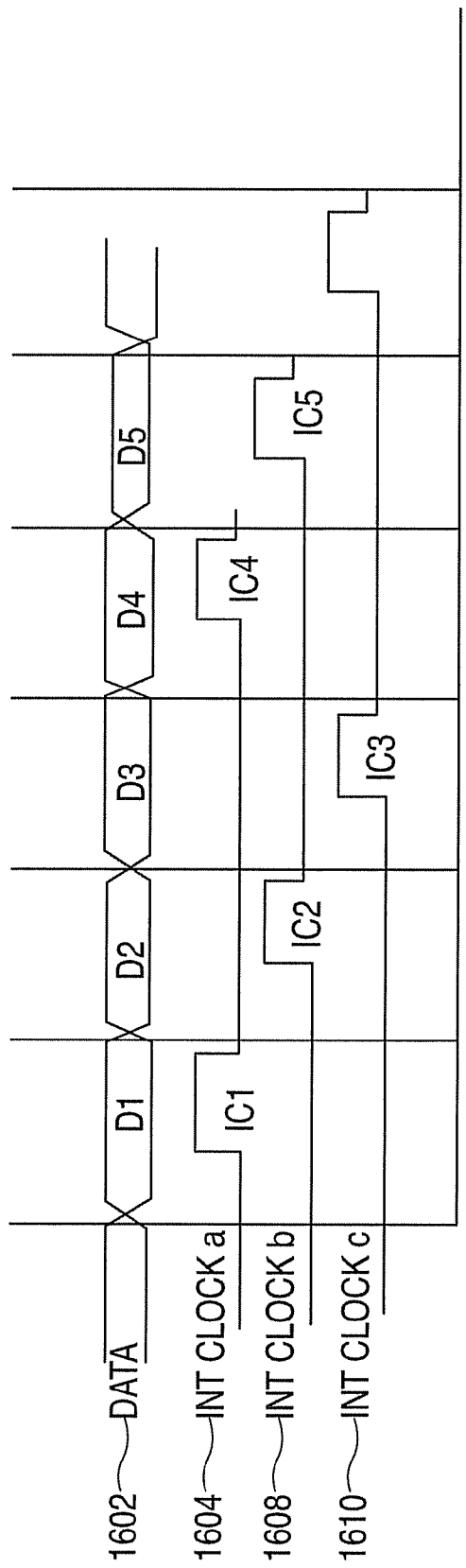
FIG. 16 depicts a timing diagram for the configuration depicted in FIG. 15.

Referring to FIGS. 15 and 16, an example is depicted of a data bus 1508 (serial or parallel, unidirectional or bidirectional, and conventional or differential signals) and a plurality of external clocks 1502, 1504 and 1506. In exemplary embodiments, data packets from the data bus 1508 are synchronized with the respective external clock 1502, 1504 or 1506 (depicted as internal clocks 1510, 1512 and 1514 when inside the circuit). The circuit 1518 receiving the data 1602 on the data bus 1508 either uses the individual external clocks 1502, 1504 and 1506 for receiving the data 1602 or, as shown in FIG. 15, "ORs" them together to form a single internal clock 1516. The resulting internal clock 1516, used to capture the data 1602 reflects all three of the external clocks 1502, 1504 and 1506. The clock signals corresponding to internal clocks 1510, 1512 and 1514 are depicted as internal clock signals 1604, 1608 and 1610 in FIG. 16.

Figure 17:
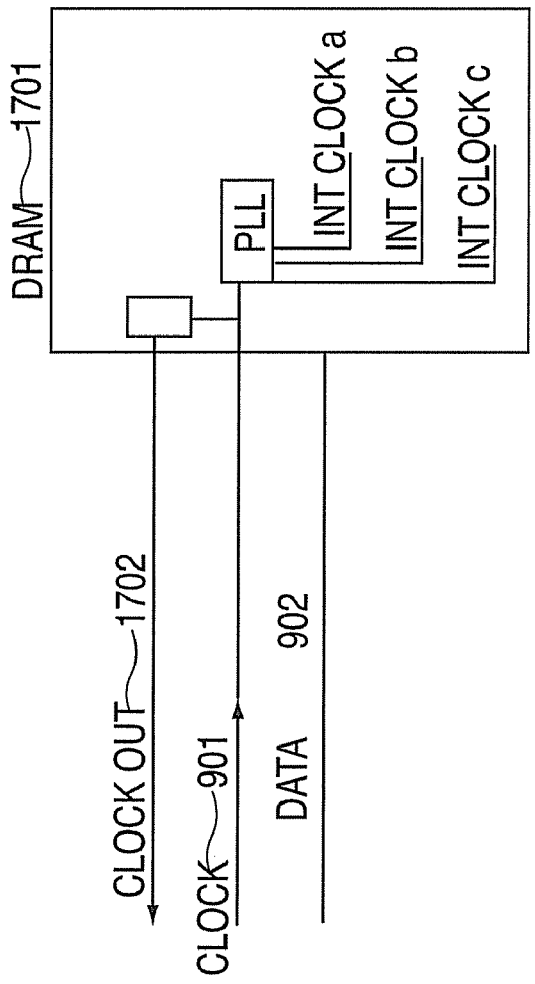
FIG. 17 depicts an exemplary embodiment where the external clock is re-driven as a clock out for timing data being sent form the circuit.
Figure 18:
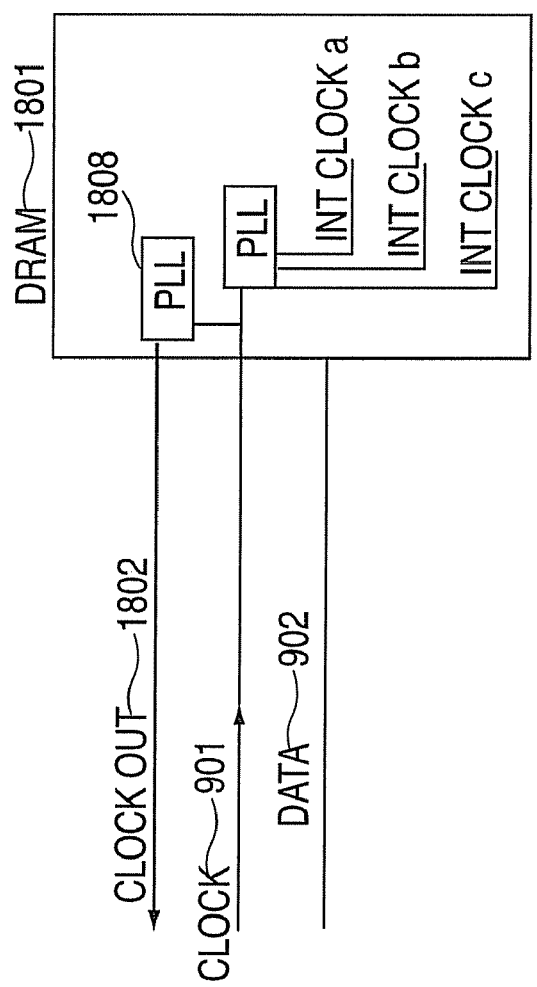
FIG. 18 depicts an exemplary embodiment where a clock out is generated based on an external clock.

FIG. 17 depicts an exemplary embodiment where the external clock 901 is re-driven as a clock out 1702 for timing data being sent from the circuit 1701. FIG. 18 depicts another variation of a circuit 1801 where the clock out 1802 is generated by a PLL 1808 based on the external clock 901. These are just two examples of how to create a clock out, any method known in the art may be utilized by exemplary embodiments.

Figure 19:
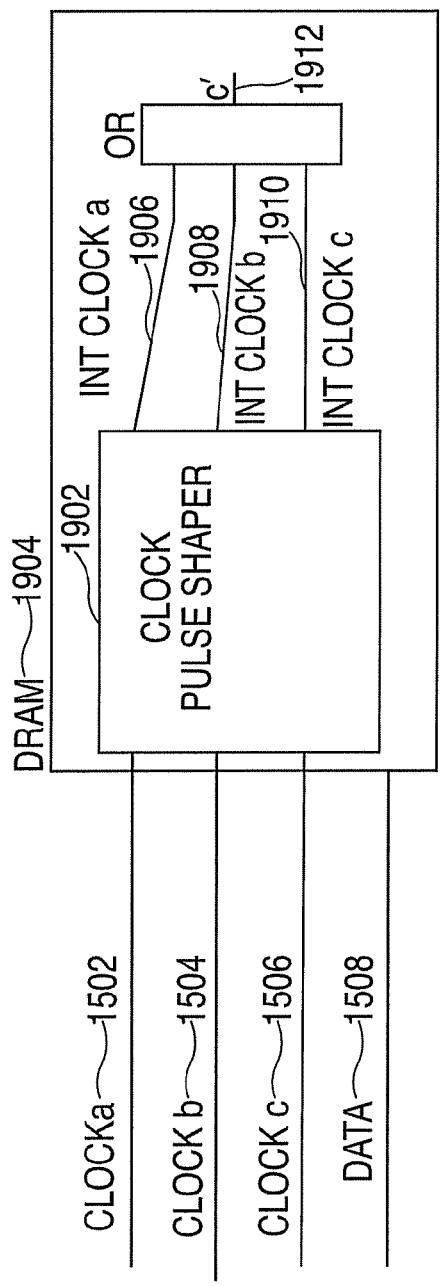
FIG. 19 illustrates an example of a system with multiple external clocks having a clock pulse shaper for deriving internal clocks from the external clocks.
Figure 20:
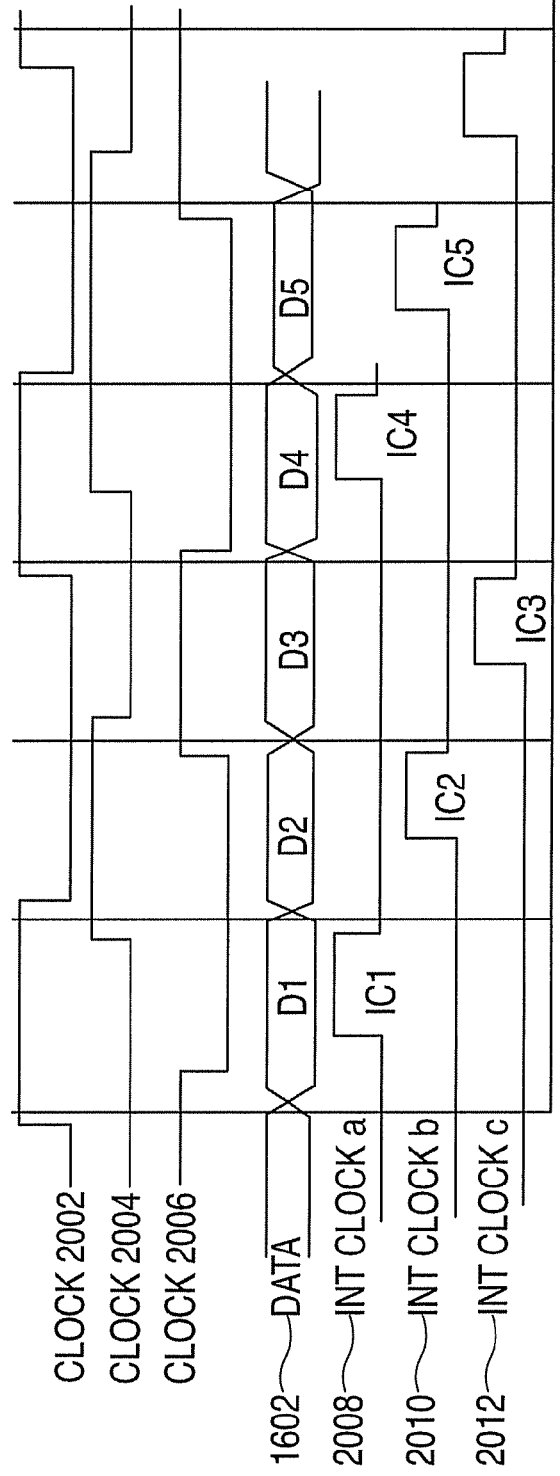
FIG. 20 depicts a timing diagram for the exemplary embodiment depicted in FIG. 19.
Figure 21:
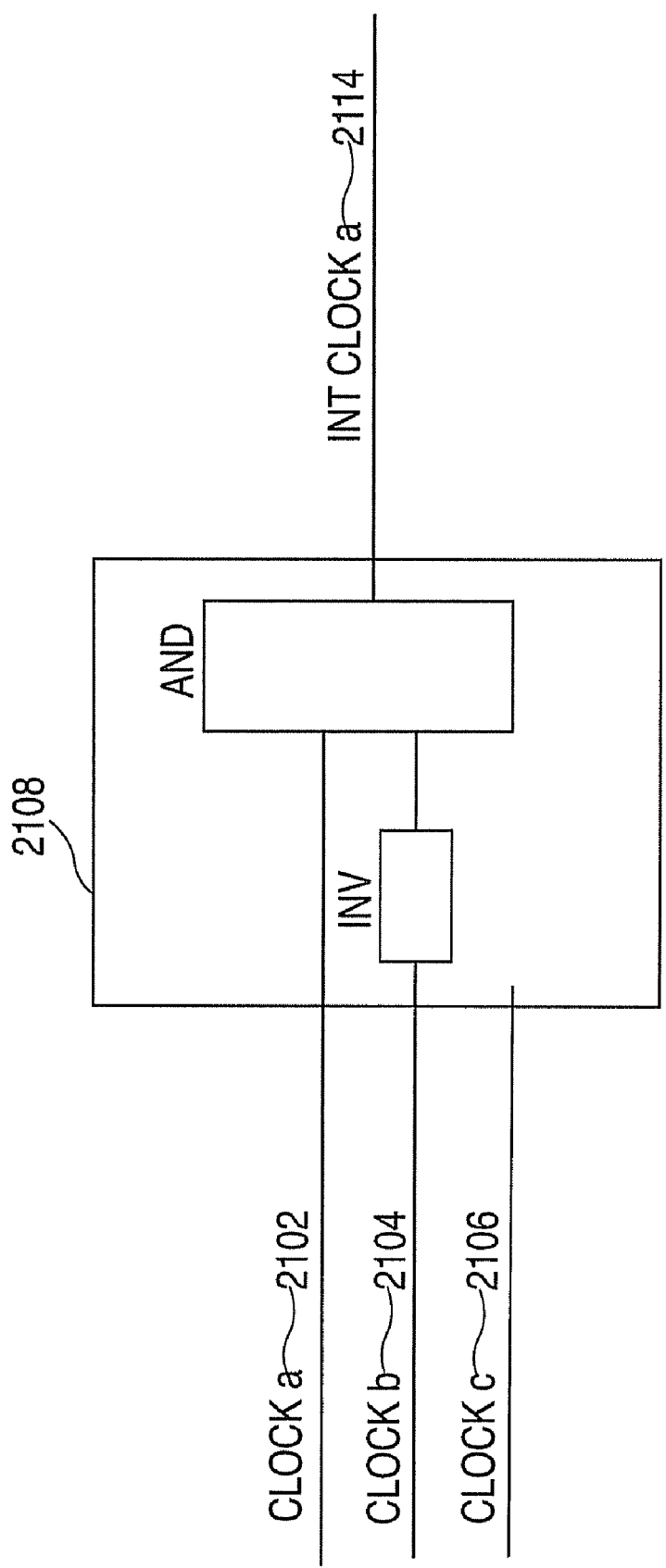
FIG. 21 depicts an exemplary embodiment where an internal clock is generated based on the relationship of two external clocks.

FIG. 19 shows an example of a circuit 1904 with multiple external clocks 1502, 1504, and 1506 having a clock pulse shaper 1902 for deriving internal clocks 1906, 1908, 1910 and 1912 from the external clocks 1502, 1504 and 1506. Such a pulse shaper 1902 would derive an internal clock(s) 1906, 1908, 1910 and 1912 by any of a variety of methods, and FIG. 20 depicts a timing diagram for the exemplary embodiment depicted in FIG. 19. FIG. 20 depicts the timing relationship between the external clock signals 2002, 2004 and 2006; the data 1602; and the internal clock signals 2008, 2010, and 2012. In one example, circuit 2108, depicted in FIG. 21, an internal clock 2114 is generated logically by the relationship of external clock 2102 and external clock 2104 and not external clock 2106.

Figure 22:
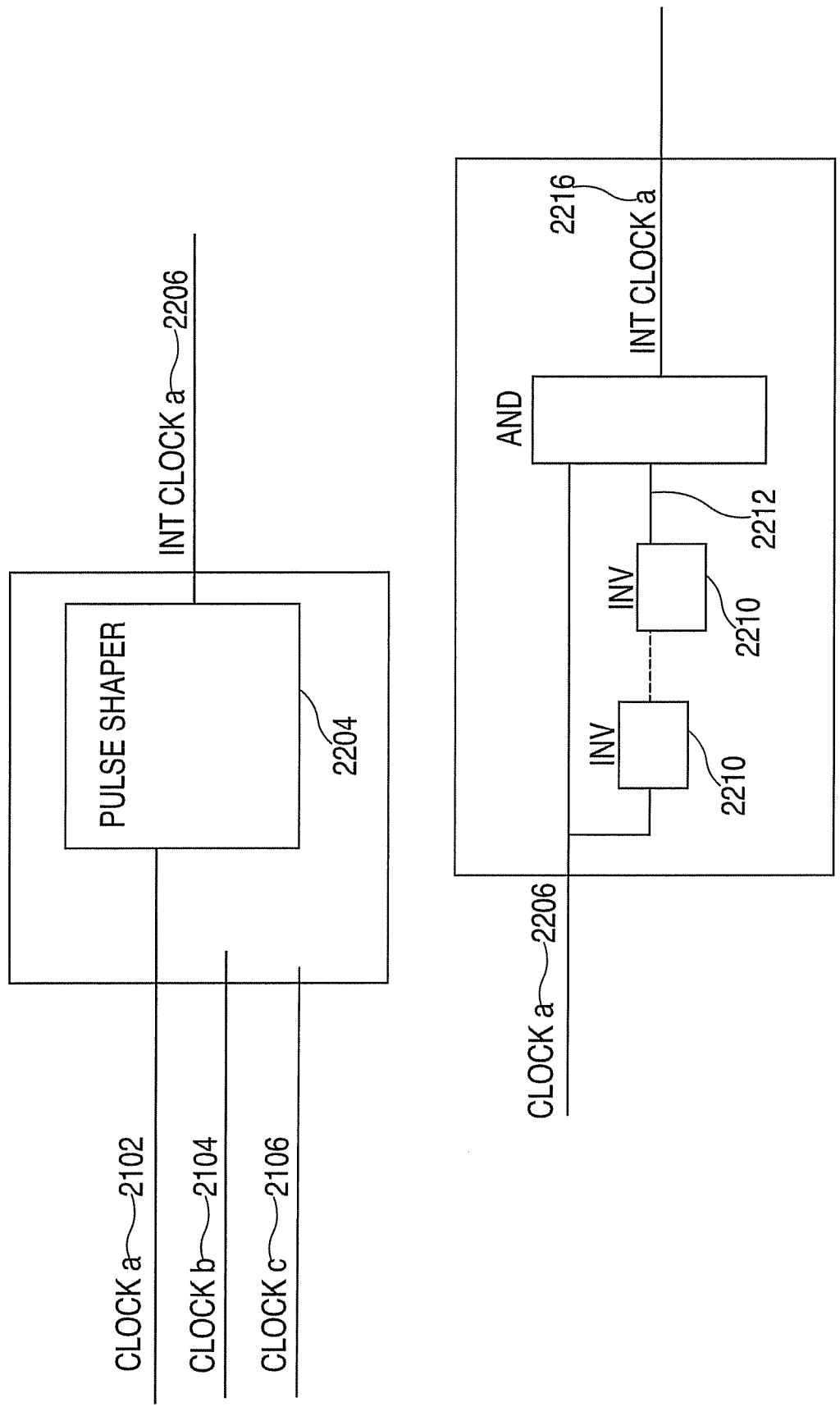
FIG. 22 depicts an exemplary method for shaping a clock pulse.

FIG. 22 depicts a further exemplary method for shaping a clock pulse. External clock 2102 is shaped by pulse shaper 2204 to produce internal clock 2206. In this example, the internal clock 2206 is fed through an odd number of inverters 2210 to create a delayed inverted version 2212 of external clock 2102. The delayed inverted version 2212 is "ANDed" with the original version to create an internal clock 2216. In another exemplary embodiment (not shown), an even number of inverters 2210 are used to create an internal clock using the trailing edge of the external clock 2102 to minimize process variations affecting the trailing edge of the generated internal clock.

In an implementation, it may be desireable to have multiple external clocks in order to customize the phases of the clocks. It may be desireable to receive clocks having overlapping active phases for example. Such clocks may be easier to generate and may provide for less power consumption on a chip die since all circuits wouldn't be switching at once.

The previous examples for shaping clocks are exemplary in nature. Other far more sophisticated methods for shaping clocks are known and can be employed by exemplary embodiments.

In several of the exemplary embodiments described herein, a single external clock period controls three phases of data capture. In other embodiments, any number of internal clocks are generated within a single external clock period. Exemplary embodiments may also employ a control circuit for determining how many internal clocks to generate per external clock period.

Figure 23:
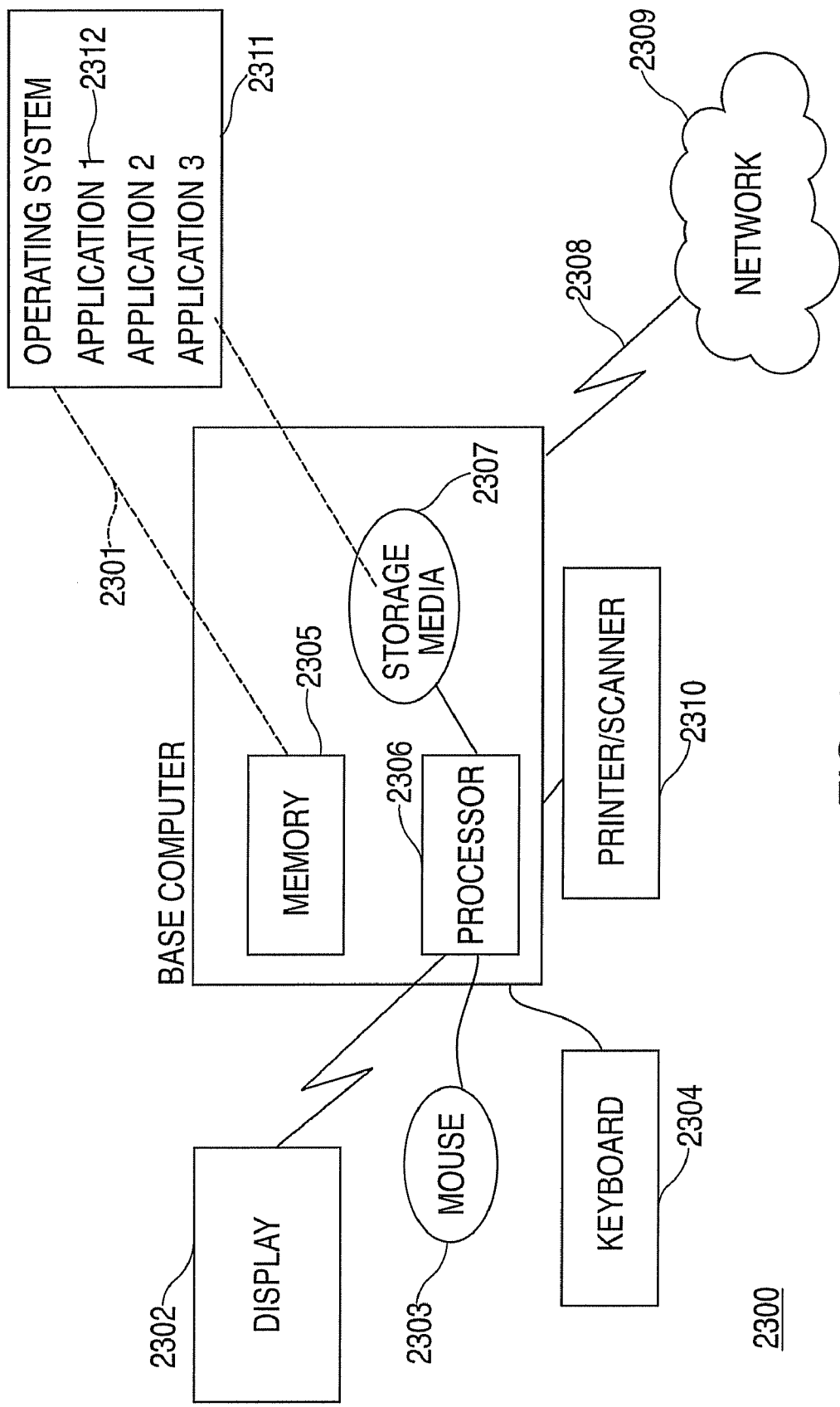
FIG. 23 illustrates a representative workstation or server hardware system in which exemplary embodiments of the present invention may be practiced.

FIG. 23 illustrates a representative workstation or server hardware system in which the present invention may be practiced. The system 2300 of FIG. 23 comprises a representative computer system 2301, such as a personal computer, a workstation or a server, including optional peripheral devices. The workstation 2301 includes one or more processors 2306 and a bus employed to connect and enable communication between the processor(s) 2306 and the other components of the system 2301 in accordance with known techniques. The bus connects the processor 2306 to memory 2305 and long-term storage 2307, or storage medium, which can include a hard drive, diskette drive or tape drive for example. The system 2301 might also include a user interface adapter, which connects the microprocessor 2306 via the bus to one or more interface devices, such as a keyboard 2304, mouse 2303, a printer/scanner 2310 and/or other interface devices, which can be any user interface device, such as a touch sensitive screen, digitized entry pad, etc. The bus also connects a display device 2302, such as an LCD screen or monitor, to the microprocessor 2306 via a display adapter.

The system 2301 may communicate with other computers or networks of computers by way of a network adapter capable of communicating 2308 with a network 2309. Example network, adapters are communications channels, token ring, Ethernet or modems. Alternatively, the workstation 2301 may communicate using a wireless interface, such as a CDPD (cellular digital packet data) card. The workstation 2301 may be associated with such other computers in a Local Area Network (LAN) or a Wide Area Network (WAN), or the workstation 2301 can be a client in a client/server arrangement with another computer, etc. All of these configurations, as well as the appropriate communications hardware and software, are known in the art.

Figure 24:
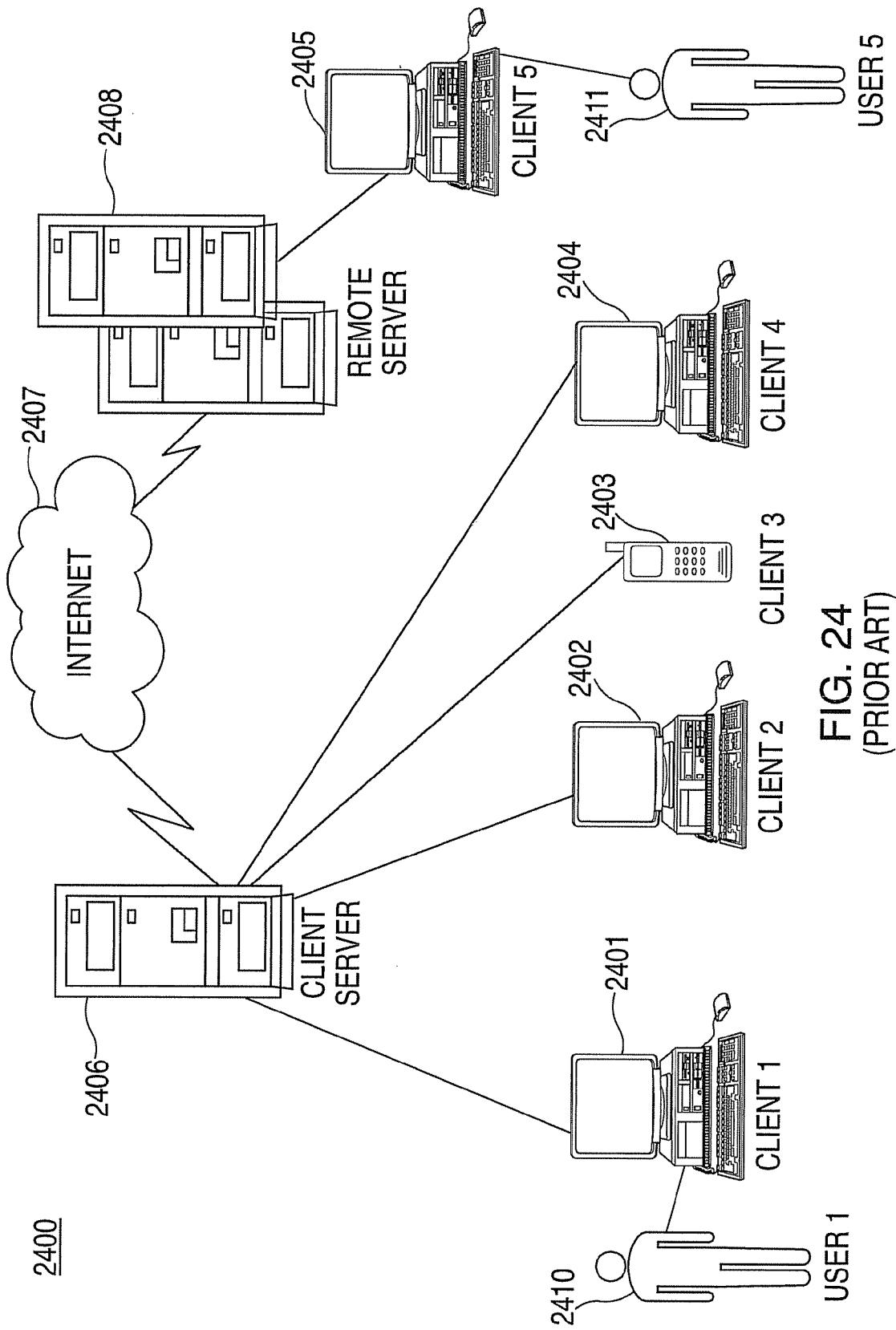
FIG. 24 illustrates a data processing network in which exemplary embodiments of the present invention may be practiced.

FIG. 24 illustrates a data processing network 2400 in which the present invention may be practiced. The data processing network 2400 may include a plurality of individual networks, such as a wireless network and a wired network, each of which may include a plurality of individual workstations 2401, 2402, 2403 and 2404. Additionally, as those skilled in the art will appreciate, one or more LANs may be included, where a LAN may comprise a plurality of intelligent workstations coupled to a host processor.

Still referring to FIG. 24, the networks may also include mainframe computers or servers, such as a gateway computer (client server 2406) or application server (remote server 2408 which may access a data repository and may also be accessed directly from a workstation 2405). A gateway computer 2406 serves as a point of entry into each network 2407. A gateway is needed when connecting one networking protocol to another. The gateway 2406 may be preferably coupled to another network (the Internet 2407 for example) by means of a communications link. The gateway 2406 may also be directly coupled to one or more workstations 2401, 2402, 2403 and 2404 using a communications link. The gateway computer may be implemented utilizing an IBM eServer zSeries® 100 Server available from IBM Corp.

Software programming code which embodies the present invention is typically accessed by the processor 2306 of the system 2306 from long-term storage media 2306, such as a CD-ROM drive or hard drive. The software programming code may be embodied on any of a variety of known media for use with a data processing system, such as a diskette, hard drive, or CD-ROM. The code may be distributed on such media, or may be distributed to users 2410 and 2411 from the memory or storage of one computer system over a network to other computer systems for use by users of such other systems.

Alternatively, the programming code 2311 may be embodied in the memory 2305, and accessed by the processor 2306 using the processor bus. Such programming code includes an operating system which controls the function and interaction of the various computer components and one or more application programs 2312. Program code is normally paged from dense storage media 2307 to high-speed memory 2305 where it is available for processing by the processor 2306. The techniques and methods for embodying software programming code in memory, on physical media, and/or distributing software code via networks are well known and will not be further discussed herein.

Exemplary embodiments include a computing system with a processor(s) and an I/O unit(s) (e.g., requesters) interconnected to a memory system that contains a memory controller and memory devices. In exemplary embodiments, the memory system includes a processor or memory controller interfaced to a set of hub devices (also referred to as "hub chips" or "buffer devices"). The hub devices connect and interface to the memory devices. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g, a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

Figure 1:
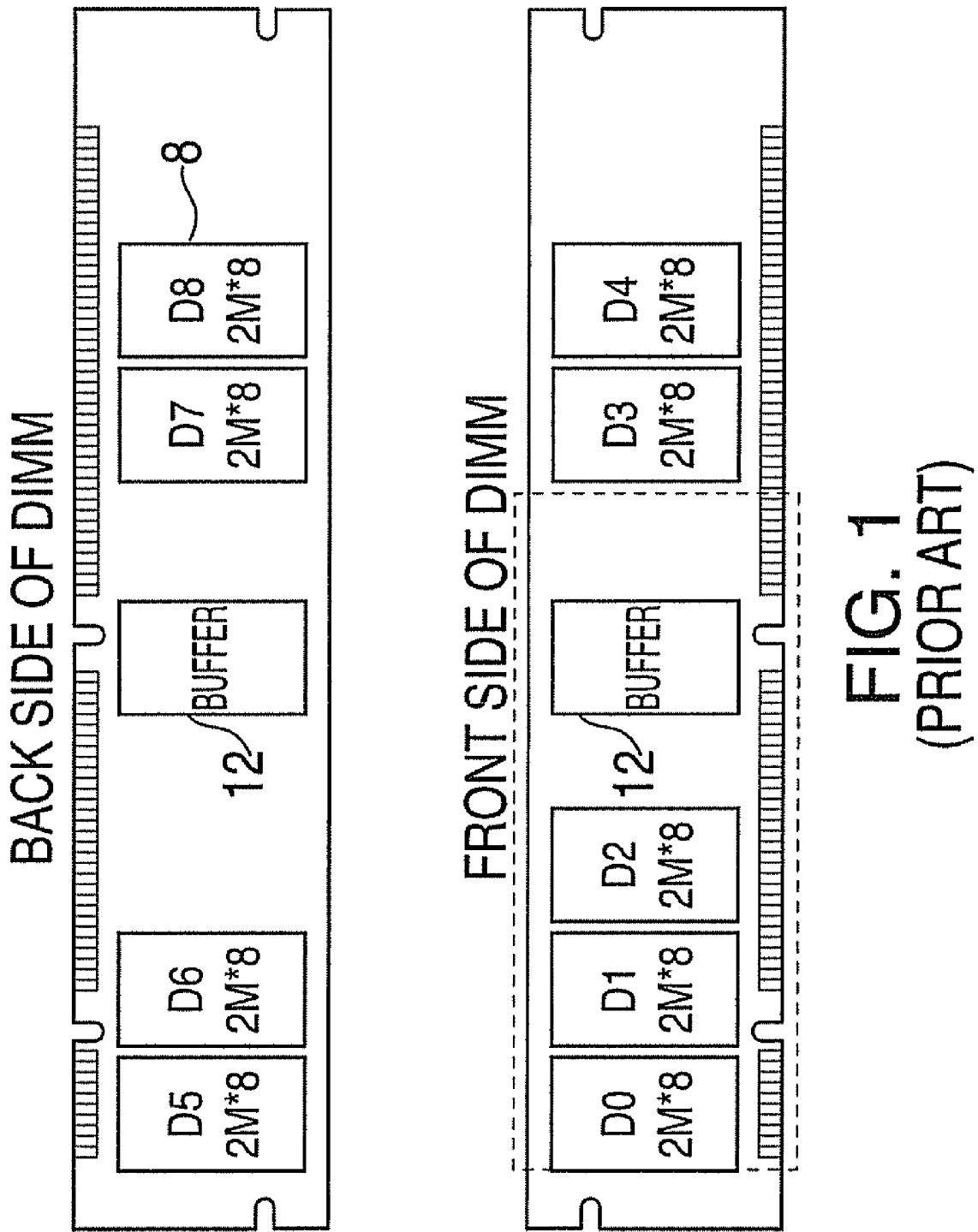
FIG. 1 depicts an exemplary early synchronous memory module.
Figure 2:
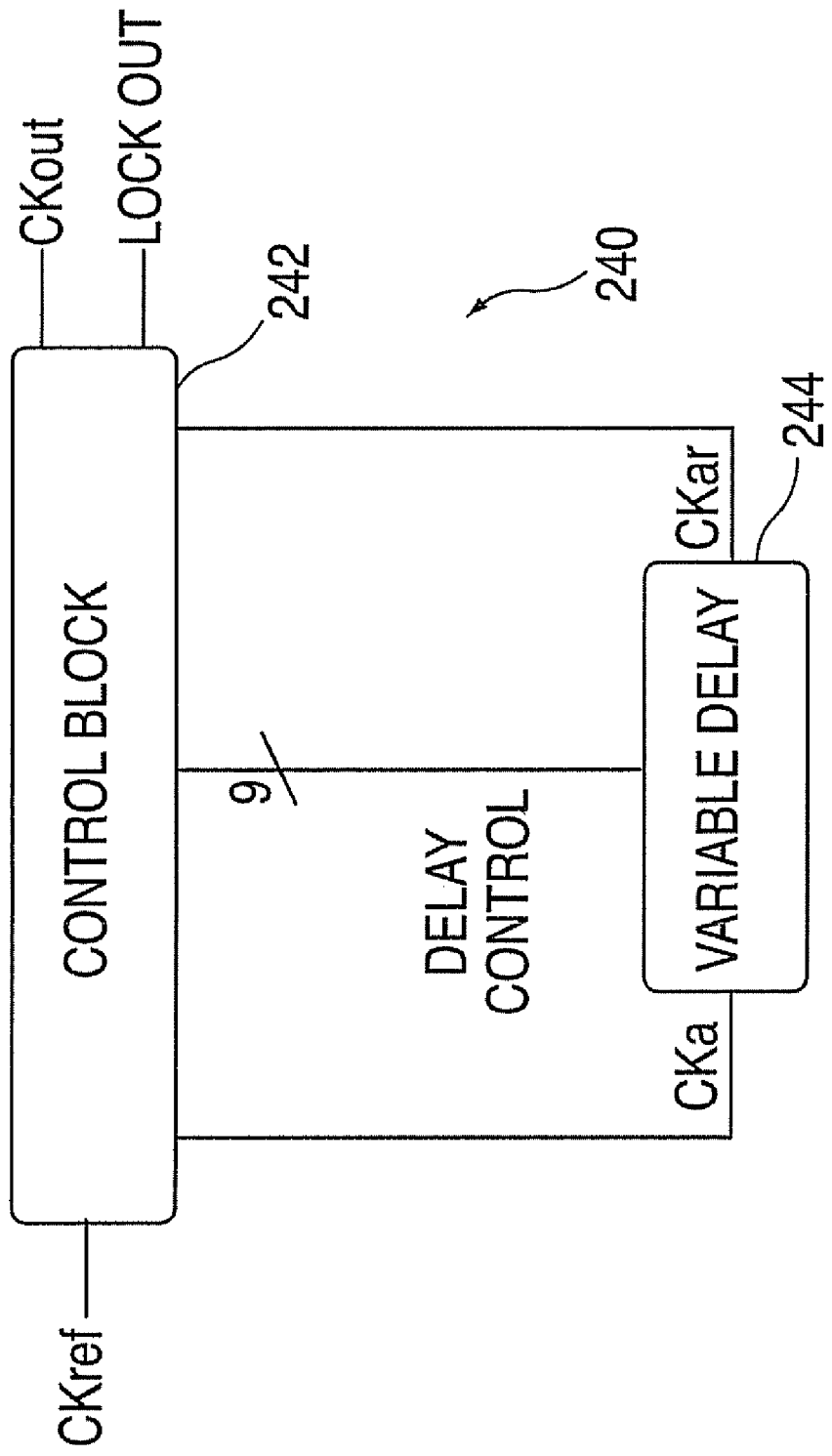
FIG. 2 depicts a block diagram of a digital phase-locked loop taught by Andresen.
Figure 3:
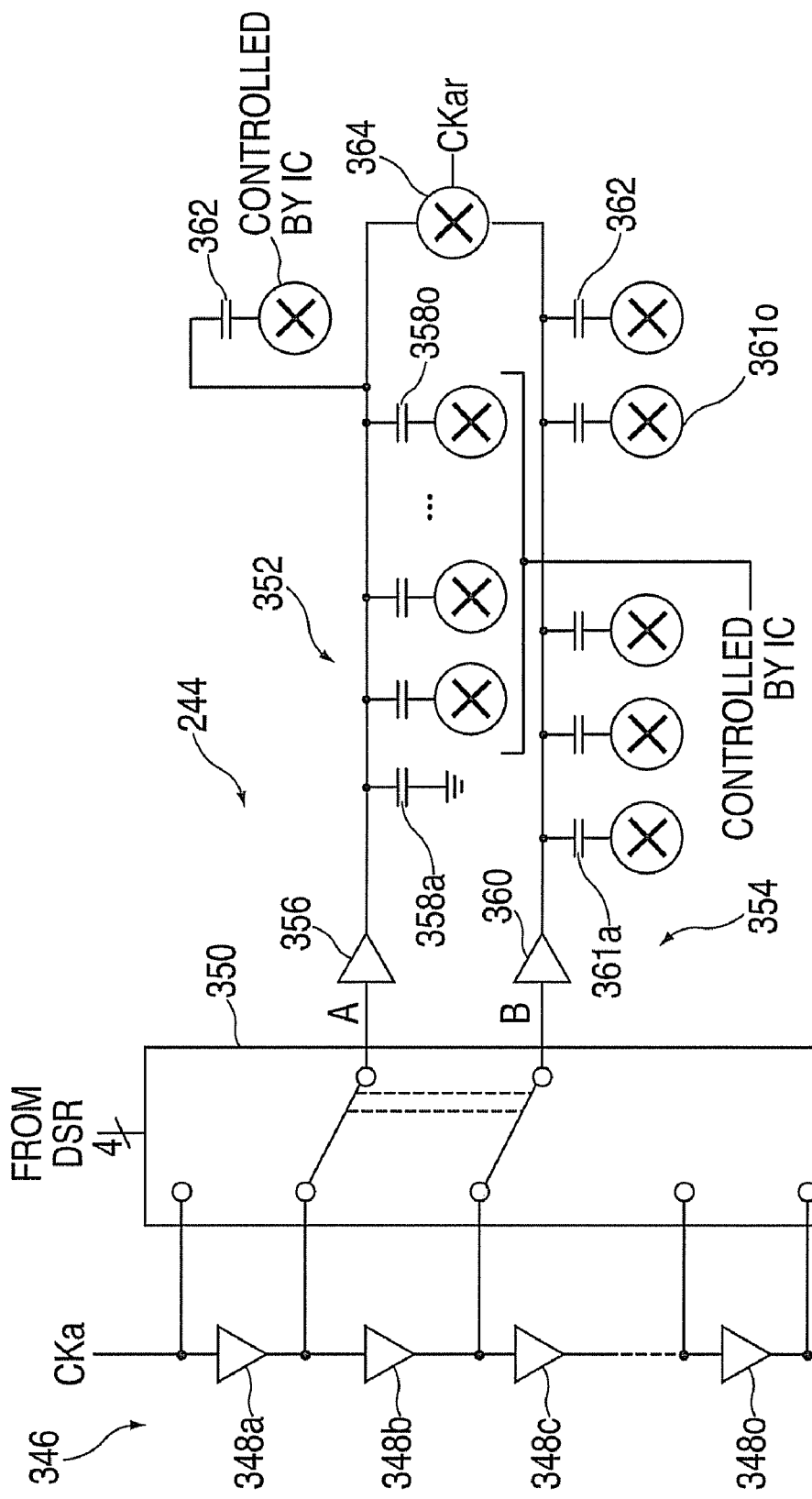
FIG. 3 depicts a block diagram of a variable delay circuit taught by Andresen.
Figure 4:
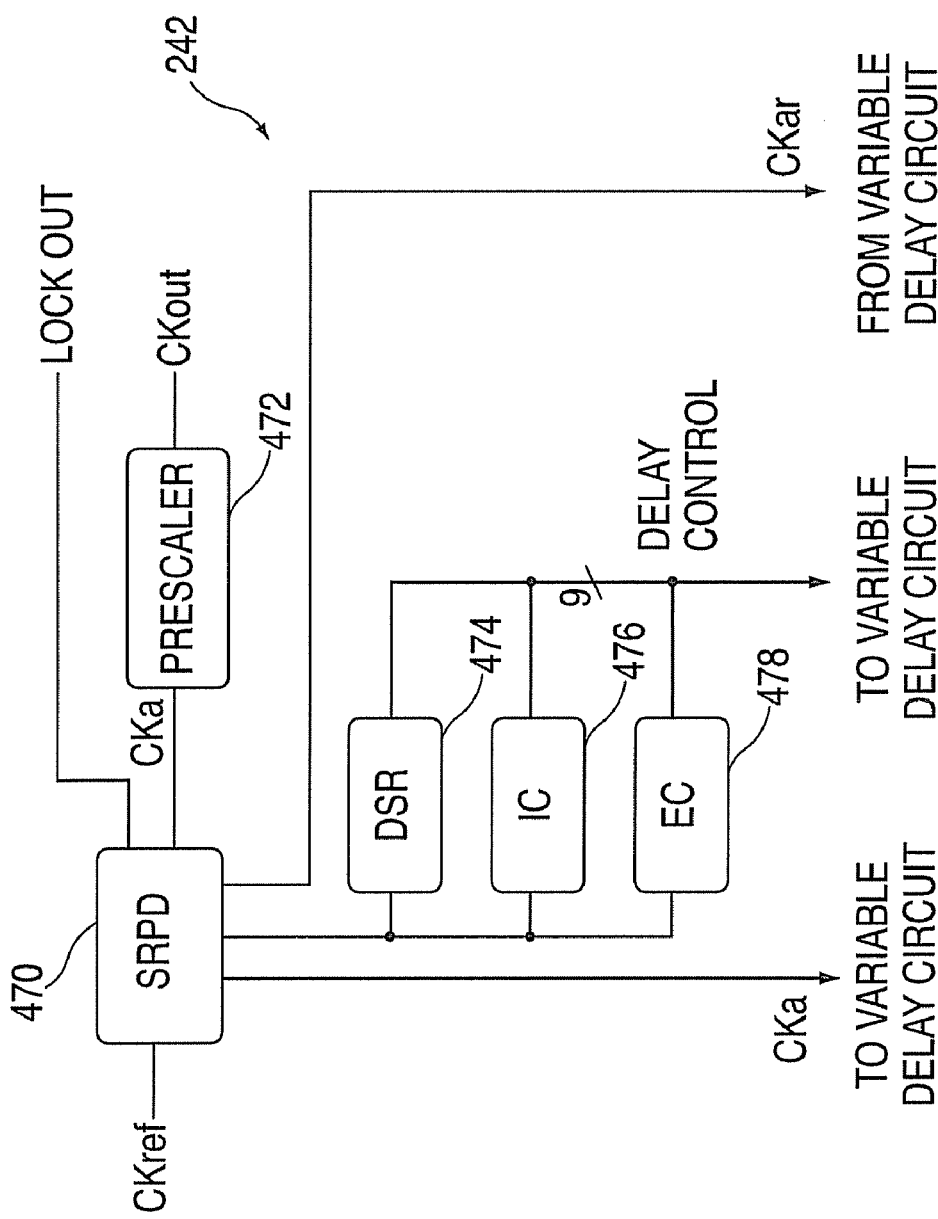
FIG. 4 depicts a block diagram of a control circuit taught by Andresen.
Figure 5:
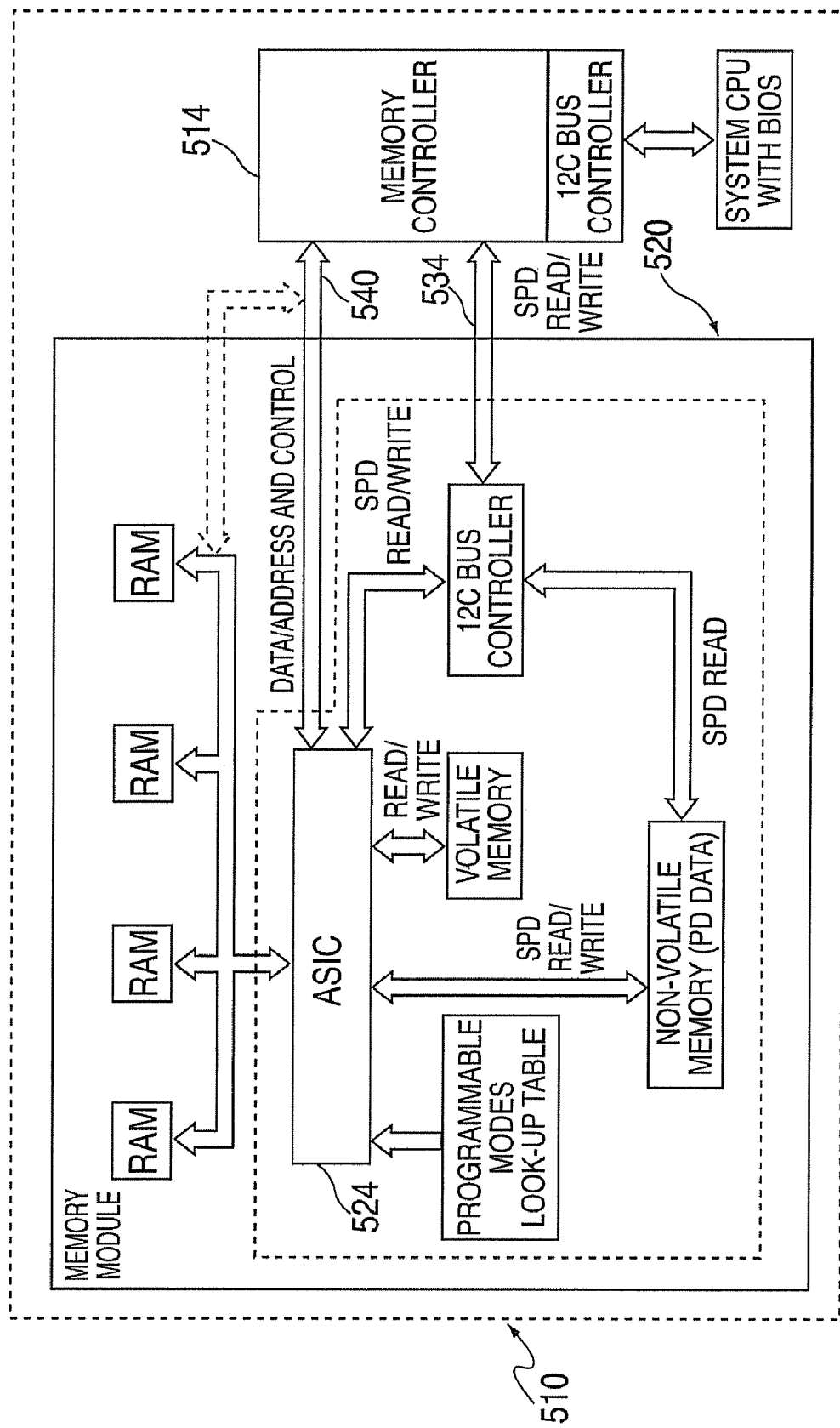
FIG. 5 depicts an exemplary computer system with a fully buffered synchronous memory module that is directly connected to a memory controller.
Figure 6:
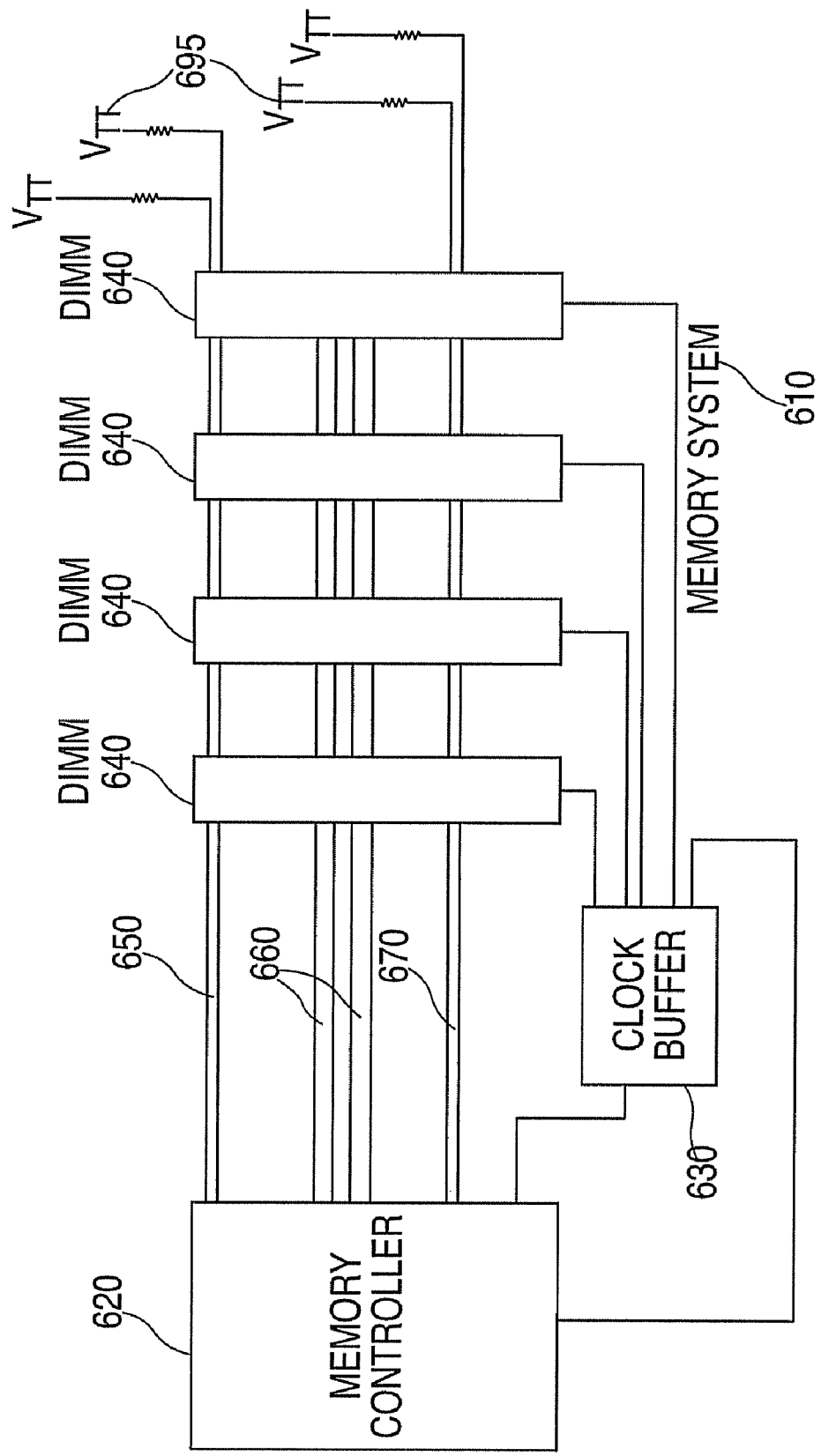
FIG. 6 depicts an exemplary memory system, shown with a single, traditional multi-drop stub bus.
Figure 7:
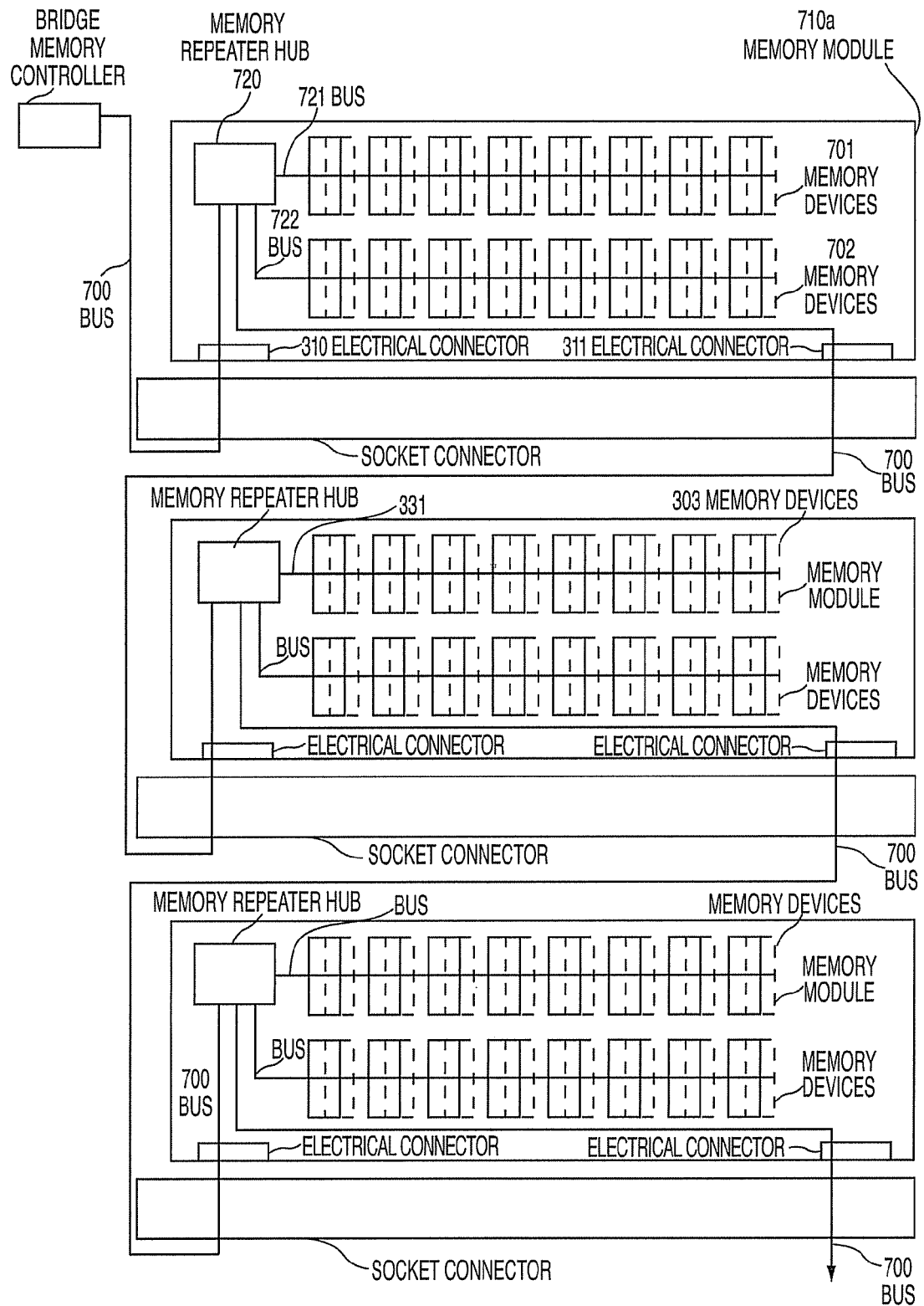
FIG. 7 depicts a fully buffered synchronous memory module and system structure, where the fully buffered synchronous memory module includes a repeater function.
Figure 8:
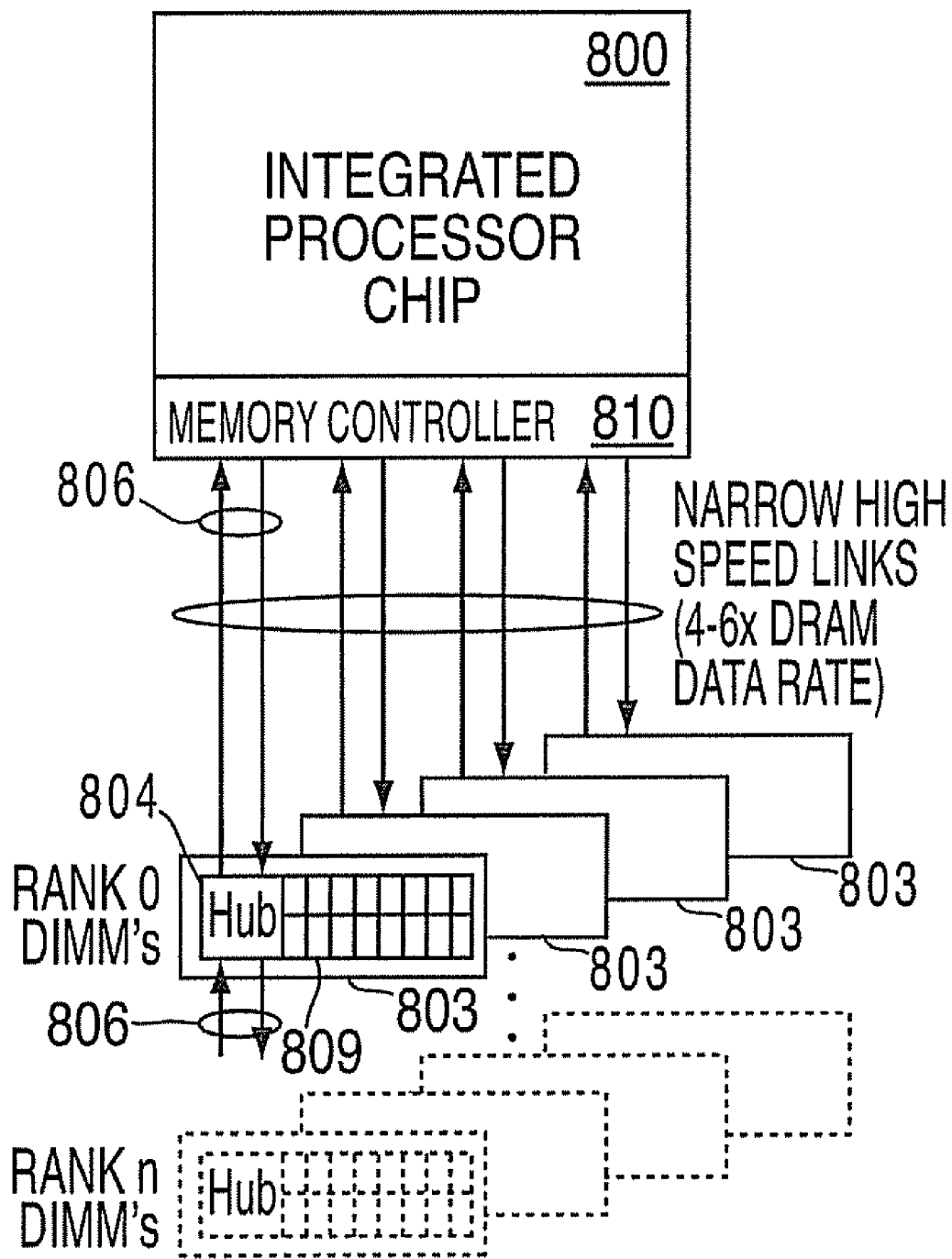
FIG. 8 depicts a block diagram of a computer memory system which includes multiple independent cascade interconnect memory interface busses that operate in unison to support a single data access request.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 1 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Technical effects and benefits of exemplary embodiments include the ability to provide support for high speed data transmission. This may result in increased bandwidth to the memory devices and thus improved throughput in the memory system.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for capturing data, the method comprising:
receiving an external clock signal having a first frequency, a first edge and a second edge, wherein a clock period of the external clock signal is the amount of time between any two successive first edges, and the external clock signal is received at an external clock port;
transforming the external clock signal into an internal clock signal based on the first edge and not the second edge of the external clock signal;
receiving parallel data at a first plurality of signal link ports, wherein the parallel data is received at a second frequency faster than the first frequency; and
capturing the received parallel data using the internal clock signal, wherein the internal clock signal consists of any one of a first internal clock signal running at the second frequency, a plurality of second internal clock signals running at the first frequency wherein each second internal clock signal comprises a pulse such that the combination of clock pulses of the plurality of second internal clock signals constitute said second frequency, or a plurality of clock signals running at the second frequency.

2. The method of claim 1 wherein the external clock signal consists of any one of the first edge is a rising edge and the second edge is a falling edge, or the first edge is a falling edge and the second edge is a rising edge.

3. The method of claim 1 wherein the parallel data comprises first data received at a first internal clock time during a first external period and second data received at a second internal clock time during the first external period.

4. The method of claim 3 wherein the first data comprises a plurality of bits of a single word of data.

5. The method of claim 3 wherein the first data comprises a plurality of bits including a first bit from a first link and a second bit from a second link, wherein data received at the second internal clock time comprises a plurality of bits including a third bit from the first link and a fourth bit from the second link, wherein the first bit and the third bit comprise bits of a first single word of data and wherein the second bit and the fourth bit comprise bits of a second single word of data.

6. The method of claim 1 wherein the transforming is performed by a phase-locked-loop circuit.

7. The method of claim 1 further comprising transmitting second parallel data on a second plurality of signal links, wherein the second parallel data is transmitted at the second frequency.

8. The method of claim 1 wherein the receiving an external clock signal, the transforming, the receiving parallel data and the capturing are performed at a memory device.

9. A system for capturing data, the system comprising:
an external clock port for receiving an external clock signal having a first frequency, a first edge and a second edge, wherein a clock period of the external clock signal is the amount of time between any two successive first edges;
a first plurality of signal link ports for receiving parallel data at a second frequency faster than the first frequency; and
logic in communication with the external clock port and the first plurality of signal link ports for facilitating:
transforming the external clock signal into an internal clock signal based on the first edge and not the second edge of the external clock signal, wherein the internal clock signal consists of any one of a first internal clock signal running at a second frequency, a plurality of second internal clock signals running at the first frequency wherein each second internal clock signal comprises a pulse such that the combination of clock pulses of the plurality of second internal clock signals constitute said second frequency, or a plurality of clock signals running at the second frequency; and
capturing the parallel data using the internal clock signal.

10. The system of claim 9 wherein the external clock port, the first plurality of signal link ports and the logic are located on a memory device.

11. The system of claim 10 wherein the internal clock signal is utilized to write the parallel data to the memory device and to read data stored on the memory device.

12. The system of claim 9 wherein the external clock port, the first plurality of signal link ports and the logic are located on a buffer device.

13. The system of claim 9 wherein the external clock port, the first plurality of signal link ports and the logic are located on a memory controller.

14. The system of claim 9 wherein the external clock signal consists of any one of the first edge is a rising edge and the second edge is a falling edge or the first edge is a falling edge and the second edge is a rising edge.

15. The system of claim 9 wherein the parallel data comprises first data received at a first internal clock time during a first external period and second data received at a second internal clock time during the first external period.

16. The system of claim 9 wherein the transforming is performed by a phase-locked-loop circuit.

17. The system of claim 9 wherein the logic further facilitates transmitting second parallel data via a second plurality of signal ports at the second frequency.

18. A service for deploying technology for high speed data transfer, the service comprising:
creating information for any one of making, using or selling technology for high speed data transfer, the technology including:
an external clock port for receiving an external clock signal having a first frequency, a first edge and a second edge, wherein a clock period of the external clock signal is the amount of time between any two successive first edges;
a first plurality of signal link ports for receiving parallel data at a second frequency faster than the first frequency; and
logic in communication with the external clock port and the first plurality of signal link ports for facilitating:
transforming the external clock signal into an internal clock signal based on the first edge and not the second edge of the external clock signal, wherein the internal clock signal consists of any one of a first internal clock signal running at the second frequency, a plurality of second internal clock signals running at the first frequency wherein each second internal clock signal comprises a pulse such that the combination of clock pulses of the plurality of second internal clock signals constitute said second frequency, or a plurality of clock signals running at the second frequency; and
capturing the parallel data using the internal clock signal; and
deploying said created information to one or more customers via a distribution process.

19. The service of claim 18, wherein the information comprises any one of circuit comprising the external clock port, the signal link ports and the logic, a design of the circuit, electrical characteristics of the circuit, or a design rule associated with the circuit, wherein the information is distributed in a tangible form consisting of any one of an ASIC chip die, a hard copy document, a soft copy electronic document, an electronic transmission or via portable media, the portable media comprising any one of a CD, a DVD, a magnetic tape, a magnetic disk, or a FLASH memory.

20. A buffer device in a memory system, the buffer device comprising:
an external clock port for receiving an external clock signal having a first frequency, a first edge, and a second edge, wherein a clock period of the external clock is the amount of time between any two successive first edges;
a first plurality of signal link ports for receiving parallel data at a second frequency faster than the first frequency; and
logic in communication with the external clock port and the first plurality of signal link ports for facilitating:
transforming the external clock signal into an internal clock signal based on the first edge and not the second edge of the external clock signal, wherein the internal clock signal consists of any one of a first internal clock signal running at the second frequency, a plurality of second internal clock signals running at the first frequency wherein each second internal clock signal comprises a pulse such that the combination of clock pulses of the plurality of second internal clock signals constitute said second frequency, or a plurality of clock signals running at the second frequency; and capturing the parallel data using the internal clock signal.

21. The buffer device of claim 20 wherein the buffer device is in communication with a memory controller via a memory bus and the parallel data is received from the memory controller via the memory bus at the first frequency.

22. The buffer device of claim 20 wherein the buffer device is in communication with a memory device via a memory device interface and the parallel data is transferred to the memory device at the second frequency.

23. A computer program product for capturing data, the computer program product comprising:
a computer readable storage medium having instructions embodied thereon, which when executed by a computer, cause the computer to execute a method comprising:
receiving an external clock signal having a first frequency, a first edge and a second edge, wherein a clock period of the external clock signal is the amount of time between any two successive first edges;
transforming the external clock signal into an internal clock signal based on the first edge and not the second edge of the external clock signal;
receiving parallel data on a first plurality of signal links, wherein the parallel data is received at a second frequency faster than the first frequency; and
capturing the received parallel data using the internal clock signal, wherein the internal clock signal consists of any one of a first internal clock signal running at the second frequency, a plurality of second internal clock signals running at the first frequency wherein each second internal clock signal comprises a pulse such that the combination of clock pulses of the plurality of second internal clock signals constitute said second frequency, or a plurality of clock signals running at the second frequency.

24. The computer program product of claim 23 wherein the external clock signal consists of any one of the first edge is a rising edge and the second edge is a falling edge, or the first edge is a falling edge and the second edge is a rising edge.

25. The computer program product of claim 23 wherein the parallel data comprises first data received at a first internal clock time during a first external period and second data received at a second internal clock time during the first external period.

26. The computer program product of claim 25 wherein the first data comprises a plurality of bits of a single word of data.

27. The computer program product of claim 25 wherein the first data comprises a plurality of bits including a first bit from a first link and a second bit from a second link, wherein data received at the second internal clock time comprises a plurality of bits including a third bit from the first link and a fourth bit from the second link, wherein the first bit and the third bit comprise bits of a first single word of data and wherein the second bit and the fourth bit comprise bits of a second single word of data.

28. The computer program product of claim 23 wherein the method further compresses transmitting second parallel data on a second plurality of signal links, wherein the second parallel data is transmitted at the second frequency.

29. The computer program product of claim 23 wherein the receiving an external clock signal, the transforming, the receiving parallel data and the capturing are performed at a memory device.

\* \* \* \* \*